United States Patent [19]
Kawasaki et al.

[11] Patent Number: 5,881,012
[45] Date of Patent: Mar. 9, 1999

[54] SEMICONDUCTOR INTEGRATED CIRCUIT

[75] Inventors: Toshiaki Kawasaki; Akinori Shibayama, both of Osaka, Japan

[73] Assignee: Matsushita Electronics Corporation, Osaka, Japan

[21] Appl. No.: 633,684

[22] Filed: Apr. 17, 1996

[30] Foreign Application Priority Data

Apr. 17, 1995 [JP] Japan ..................................... 7-091002

[51] Int. Cl.$^6$ .............................. G11C 5/14; H03K 3/353
[52] U.S. Cl. ...................... 365/226; 365/189.09; 327/537
[58] Field of Search ........................ 365/189.09, 189.11, 365/226; 327/536, 537, 540, 541

[56] References Cited

U.S. PATENT DOCUMENTS

| | | | |
|---|---|---|---|
| 5,335,205 | 8/1994 | Ogihara | 365/189.09 |
| 5,396,114 | 3/1995 | Lee | 327/538 |
| 5,434,820 | 7/1995 | Kim | 365/189.09 |
| 5,446,418 | 8/1995 | Hara | 365/189.09 |
| 5,526,253 | 6/1996 | Duley | 363/59 |

*Primary Examiner*—David C. Nelms
*Assistant Examiner*—Son Mai
*Attorney, Agent, or Firm*—McDermott, Will & Emery

[57] ABSTRACT

A frequency switching circuit is controlled by a low address strobe signal XRAS. A sub-boosted power supply generating circuit is driven at a low frequency generated by a first oscillating circuit during the standby of a DRAM, and at a high frequency generated by a second oscillating circuit during the operation of the DRAM. The sub-boosted power supply generating circuit is driven in a shorter cycle during the operation than during the standby. Consequently, charges are supplied to a booster power source to boost the voltage level thereof. Accordingly, even if the period of the operation state is increased, a drop in voltage level of the boosted power supply caused by a transistor off leak current and a junction leak current can be controlled. Thus, the malfunction of a circuit can be prevented from occurring due to the drop in voltage level of the boosted power supply. The drop in voltage level of the boosted power supply can be controlled during the operation of the DRAM so that it is possible to implement a boosted power supply generating circuit which can prevent the malfunction of the circuit from occurring.

19 Claims, 13 Drawing Sheets

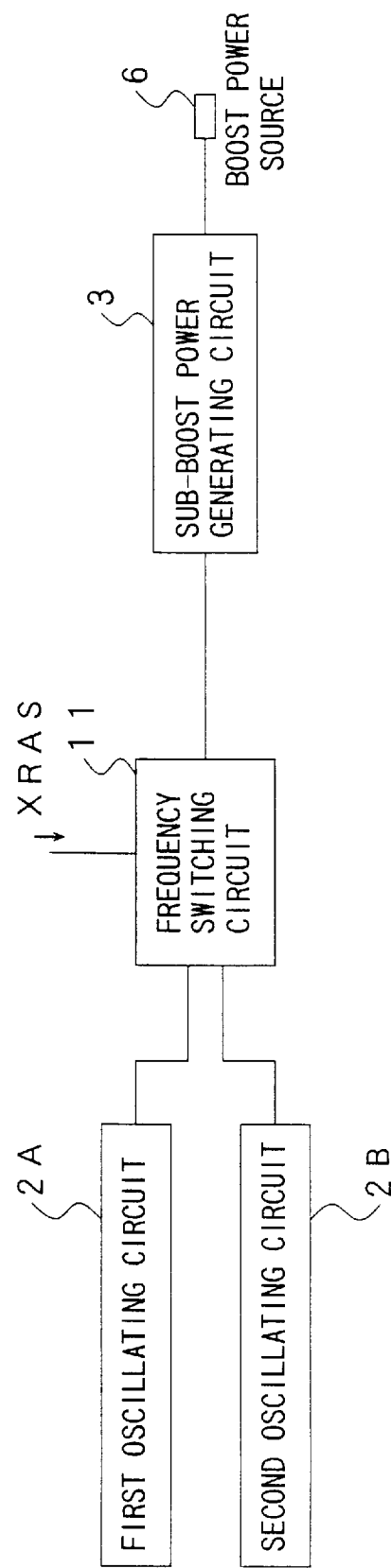

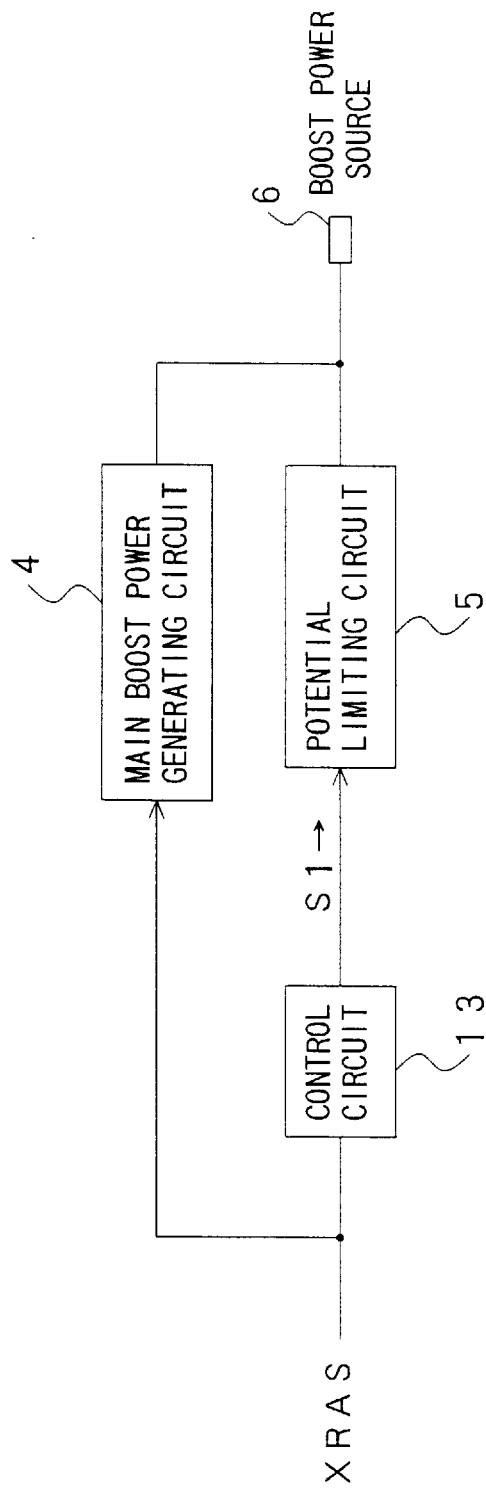

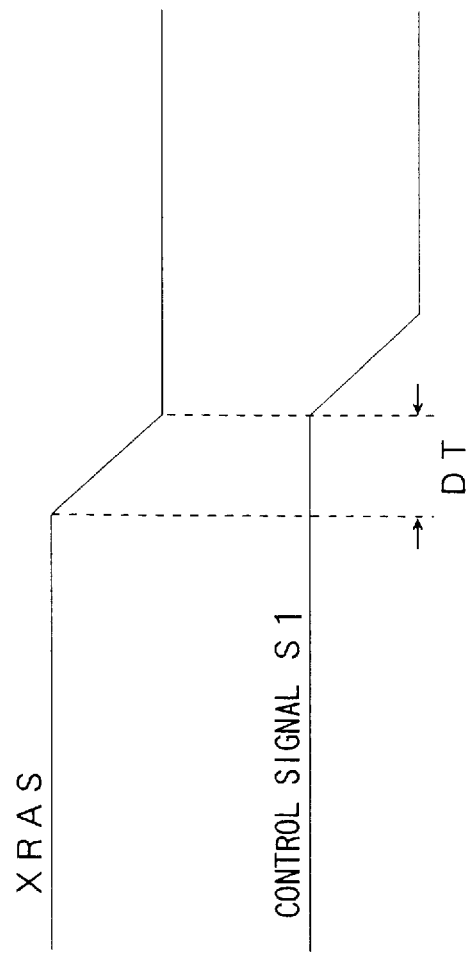

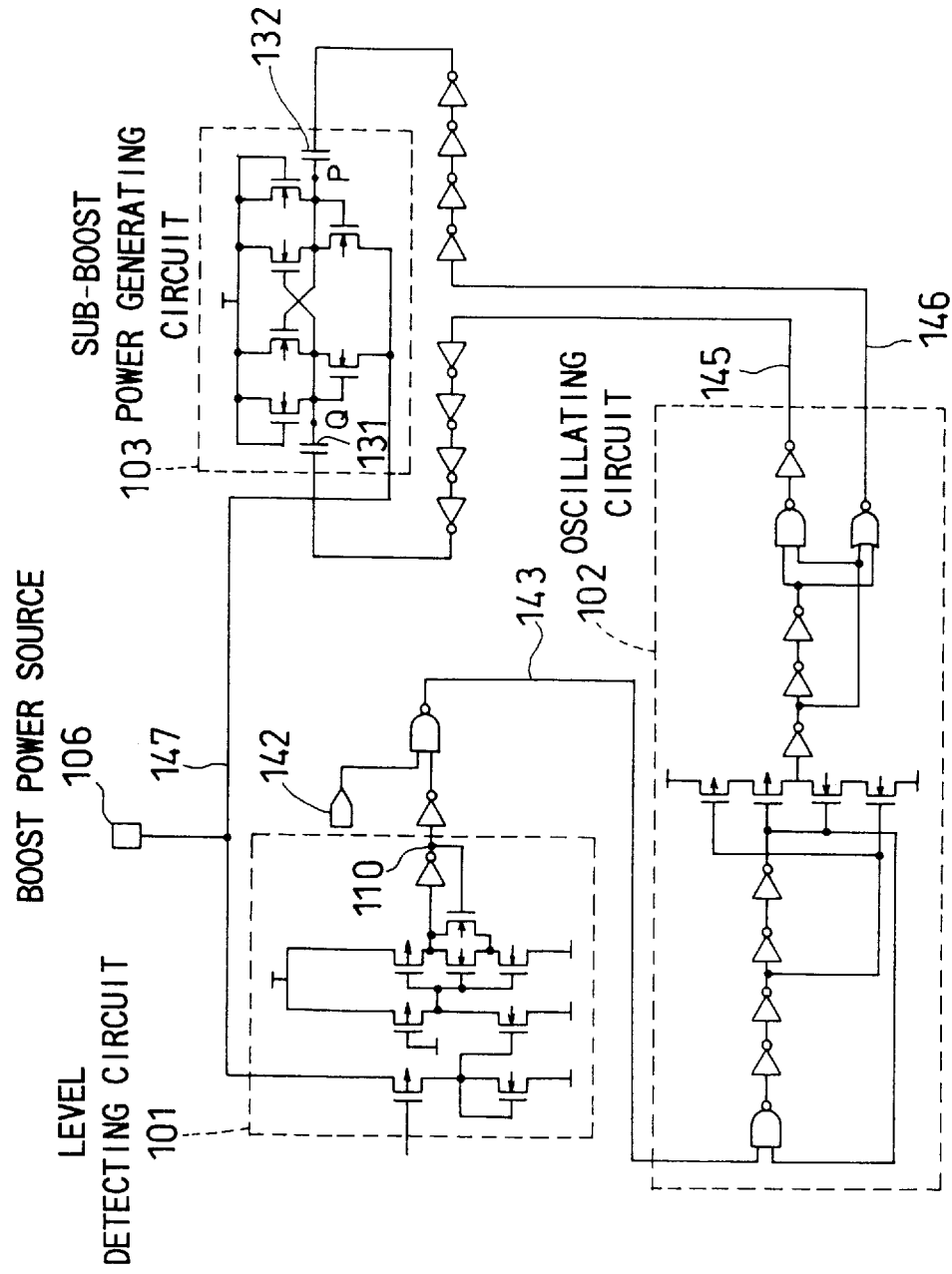

SEMICONDUCTOR INTEGRATED CIRCUIT

BACKGROUND OF THE INVENTION

The present invention relates to a semiconductor integrated circuit comprising a boosted power supply generating circuit which supplies charges to an internal boosted power supply in a DRAM or the like.

Recently, the capacity of a dynamic RAM (hereinafter referred to as a DRAM) has been increased so that the area of a semiconductor chip has become greater. An increase in chip size is the minus factor of a gain in speed of the access time of the DRAM. A continuous boosting method has been employed as the technology for realizing the gain in speed of the DRAM. The continuous boosting method serves to increase the speed of the operation of the DRAM and is very effective in the extension of a pause time, the enlargement of an operating margin during sense and the like by setting the level of a word line to a boost level in the same manner as a boosting method according to the prior art.

For example, Japanese Laid-Open Patent No. 4-301998 has disclosed the boost technology using the continuous boosting method.

An example of a boosted power supply generating circuit according to the prior art will be described below with reference to the drawings. FIG. 13 is a block diagram schematically showing a boosted power supply generating circuit 100 according to the prior art. In FIG. 13, 101 designates a level detecting circuit, 102 designates an oscillating circuit, 103 designates a sub-boosted power supply generating circuit, 104 and 105 designate a main boosted power supply generating circuit and a potential limiting circuit for operating on receipt of a low address strobe signal (hereinafter referred to as XRAS) respectively, and 106 designates a boosted power supply. The sub-boosted power supply generating circuit 103 continuously operates so as to hold the voltage level of the boosted power supply 106 to a proper level during the standby of a DRAM. In order to reduce power consumption during the standby, a charge supply capability is set lower. The main boosted power supply generating circuit 104 operates only during the operation of the DRAM. A lot of circuits connected to the boosted power supply 106 operate during the operation of the DRAM so that the charges of the boosted power supply 106 are consumed. Consequently, the charge supply capability of the main boosted power supply generating circuit 104 is set higher.

FIG. 9 is an electric circuit diagram showing the detailed structure of the level detecting circuit 101, the oscillating circuit 102 and the sub-boosted power supply generating circuit 103 shown in FIG. 13. As shown in FIG. 9, the level detecting circuit 101 is connected to the oscillating circuit 102 by a control signal line 143 for transmitting a control signal. The control signal line 143 is connected to an input terminal 142 and a node 110 of the level detecting circuit 101 through a NAND circuit. The oscillating circuit 102 is connected to the sub-boosted power supply generating circuit 103 through signal lines 145 and 146. The sub-boosted power supply generating circuit 103 is connected to the level detecting circuit 101 through the boosted power supply 106.

The level detecting circuit 101 generates a control signal for controlling the oscillating circuit 102 based on the voltage level of the boosted power supply 106. The control signal is input to the oscillating circuit 102 through the node 110 and the signal line 143. A NAND circuit, an inverter, a MOS transistor, a NOR circuit and the like are provided in the oscillating circuit 102. The oscillating circuit 102 operates on receipt of the control signal sent from the level detecting circuit 101.

The circuit shown in FIG. 9 has a structure in which an input to the input terminal 142 is set to the "H" level, the voltage level of the boosted power supply 106 is detected by the level detecting circuit 101, and the result thus obtained is reflected in the voltage level (H or L) of the control signal line 143 so that the operation and non-operation of the oscillating circuit 102 are controlled. If the voltage level of the boosted power supply 106 is higher than a set voltage level, the output signal of the node 110 of the level detecting circuit 101 has the "L" level. Consequently, the control signal of the control signal line 143 sent to the oscillating circuit 102 has the "L" level so that the oscillating circuit 102 does not operate. Accordingly, an oscillating signal is not input to the signal lines 145 and 146 so that the subboosted power supply generating circuit 103 does not operate. On the contrary, if the voltage level of the boosted power supply 106 is lower than the set voltage level, the output signal of the node 110 of the level detecting circuit 101 has the "H" level. Accordingly, the control signal of the control signal line 143 has the "H" level so that the oscillating circuit 102 operates. Then, the sub-boosted power supply generating circuit 103 operates so that an oscillating signal is output to the signal lines 145 and 146. The voltage level of the internal side plate of a capacitor 131 (or the internal side plate of a capacitor 132) of the sub-boosted power supply generating circuit 103 is boosted by the voltage level of the capacitor 131 (or the capacitor 132) in response to the. oscillating signal so that charges are supplied to the boosted power supply 106 through a boost power line 147. Consequently, the voltage level of the boosted power supply 106 is boosted.

Recently, members forming an element have become thinner remarkably with the finer structure of the DRAM. For this reason, the potential limiting circuit 105 shown in FIG. 13 is provided in order to limit a voltage applied to the element and ensure the responsibility of the element. The potential limiting circuit 105 limits the voltage level of the boosted power supply 106 to a voltage level which is higher than a predetermined first power level by the threshold voltage of a memory cell transistor.

FIG. 10 is a circuit diagram for explaining the operation of the potential limiting circuit 105. As shown in FIG. 10., the potential limiting circuit 105 comprises a level shift portion 151 and a charge drawing portion 152. A control signal is input to the level shift portion 151 through an input terminal 153. An output which is level-converted by the level shift portion 151 is input to the charge drawing portion 152 through a signal line 154. An NMOS transistor 155 having a threshold voltage which is almost equal to that of the memory cell transistor is provided on the charge drawing portion 152. The NMOS transistor 155 is provided between the boosted power supply 106 and a first power source 156, and the gate of the NMOS transistor 155 is connected to the signal line 154. When the control signal input from the input terminal 153 has the "L" level, the output of the level shift portion 151 is set to the voltage level of the boosted power supply 106, the NMOS transistor 155 is turned ON, and the charges of the boosted power supply 106 are drawn to the first power source 156 so as to lower the voltage level of the boosted power supply 106 to a voltage level (set value) which is higher than the voltage level of the first power source 156 by the threshold voltage of the NMOS transistor 155. It is concerned that the voltage level of the first power source 156 is varied by drawing the charges toward the first power source 156. However, circuits for consuming the charges are connected to the first power source 156 and operates to consume the charges so that the voltage level is kept stable.

The general operation of the boosted power supply generating circuit 100 having each portion formed in the above manner will be described below with reference to FIG. 13 and the like.

When XRAS has the "H" level, that is, during the standby of the DRAM, the oscillating circuit 102 operates on receipt of a signal output from the level detecting circuit 101 so that the sub-boosted power supply generating circuit 103 is driven if the voltage level of the boosted power supply 106 is lower than the detection level of the level detecting circuit 101. Consequently, the charges are supplied to the boosted power supply 106 so that the voltage level of the boosted power supply 106 is boosted. If the voltage level of the boosted power supply 106 is higher than the detection level, the oscillating circuit 102 does not operate. Consequently, the sub-boosted power supply generating circuit 103 is not driven. In this case, the main boosted power supply generating circuit 104 and the potential limiting circuit 105 do not operate.

When XRAS is changed from the "H" level to the "L" level, that is, during the operation of the DRAM, the main boosted power supply generating circuit 104 is driven synchronously with the fall of XRAS. Consequently, the charges are supplied to the boosted power supply 106 so that the voltage level of the boosted power supply 106 is boosted. Consequently, the potential of a word line connected to the gate of the memory cell transistor which stores information is caused to rise. The main boosted power supply generating circuit 104 is driven only synchronously with the fall of XRAS. Hence, the main boosted power supply generating circuit 104 does not have the function of holding the voltage level of the boosted power supply 106. Accordingly, the sub-boosted power supply generating circuit 103 is caused to operate also during the operation of the DRAM so that the charges are supplied to the boosted power supply 106 to hold the voltage level. The main boosted power supply generating circuit 104 has the high charge supply capability. For this reason, there is a possibility that the voltage level of the boosted power supply 106 is increased too much. Consequently, the potential limiting circuit 105 is caused to operate synchronously with the fall of XRAS so that the charges of the boosted power supply 106 are drawn while XRAS has the "L" level. Thus, the voltage level of the boosted power supply 106 is lowered to a set value.

The operation of the output circuit of the DRAM connected to the boosted power supply 106 and the like will be described below with reference to FIG. 11.

As shown in FIG. 11, a control circuit 181 for outputting a control signal S2 on receipt of XRAS, a column address strobe signal (hereinafter referred to as XCAS), an output enable signal (hereinafter referred to as XOE) and a write enable signal (hereinafter referred to as XWE), a NAND circuit 183 for executing the NAND operation of the control signal S2 and an output data signal, and an AND circuit 184 for executing the AND operation of the control signal S2 and the inverted output data signal are provided on the input side of a boost circuit 182. An output circuit 108 is provided on the output side of the boost circuit 182. The output circuit 108 comprises NMOS transistors 185 and 186 connected between a first power source and a ground power source. The NMOS transistor 185 is controlled by the output of the boost circuit 182. The NMOS transistor 186 is controlled by the output of the AND circuit 184. Data is output to an output terminal 189 connected between the NMOS transistors 185 and 186.

FIG. 12 is a circuit diagram showing the internal structure of the boost circuit 182 in FIG. 11. The output of the NAND circuit 183 is sent to an input terminal 201 of the boost circuit 182. The input terminal 201 is connected to one of the electrodes of a capacitor 205 through an inverter 202, a delay circuit 203 and an inverter 204. The other electrode of the capacitor 205 is connected to an output terminal 208 for outputting a control signal to the NMOS transistor 185 of an output circuit. An NMOS transistor 206 is provided between the input terminal 201 and the output terminal 208. The gate electrode of the transistor 206 is connected to a first power source. Furthermore, an NMOS transistor 207 is provided between the input terminal 201 and the output terminal 208. The output of the inverter 202 is sent to the gate electrode of the transistor 207.

In the boost circuit 182 shown in FIG. 12, the output signal is set to the "L" level by the operation of the transistor 207 when the input signal has the "L" level. On the other hand, when the input signal is changed from the "L" level to the "H" level, the voltage level of the output signal is raised to the voltage level −Vth of the first power source by the operation of the transistor 206, wherein Vth is the threshold voltage of the transistor 206.

At this moment, the output of the inverter 204 has the "L" level. For this reason, the capacitor 205 is charged to VDD−Vth. After a delay time determined by the delay circuit 203, the inverter 204 raises the potential of one of the electrodes of the capacitor 205. Consequently, the voltage level of an output signal is set to VDD+α (α>0). In other words, when a signal input to the boost circuit 182 is set to the "H" level, the output signal of the boost circuit 182 is set to a higher boost level than that of the input signal.

Referring to the circuit shown in FIG. 11, when the data reading operation is determined, the gate of the NMOS transistor 185 is set to the "L" level by the boost circuit 182 and the gate of the NMOS transistor 186 is set to the "H" level by the AND circuit 184 if an output data signal has the "L" level. Accordingly, the NMOS transistor 185 is turned OFF and the NMOS transistor 186 is turned ON so that Low data is output to the output terminal 189. If the output data signal has the "H" level, the gate of the NMOS transistor 185 is set to a boost level by the boost circuit 182 and the gate of the NMOS transistor 186 is set to the "L" level by the AND circuit 184. Accordingly, the NMOS transistor 185 is turned ON and the NMOS transistor 186 is turned OFF so that High data is input to the output terminal 189.

When outputting the High data, the following problems arise if the gate of the NMOS transistor 185 is not set to a boost voltage. When setting the voltage level of the first power source to VDD and outputting the High data, only the voltage level VDD−Vth is output to the output terminal 189 if the voltage level of the gate of the NMOS transistor 185 is VDD and the threshold voltage of the NMOS transistor 185 is set to Vth. In the case where the potential of the gate of the NMOS transistor 185 is set to a boost voltage VDD+Vth, the voltage level of the output terminal 189 is set to a voltage level of VDD+Vth−Vth=VDD so that the sufficient High data can be obtained. In the output circuit of the DRAM, thus, the gate terminal of the NMOS transistor 185 is set to the boost voltage so that the sufficient High data can be output when reading the High data.

However, the above structure has the following problems.

A first problem will be described below. When XRAS has the "L" level, that is, in operation mode, a junction leak current and a transistor off leak current are generated on a junction portion and a transistor connected to the boosted power supply 106. Consequently, if charge consumption exceeds the charge supply capability of the sub-boosted power supply generating circuit 103, the voltage level of the boosted power supply 106 is gradually decreased. In particular, when the period for which XRAS has the "L" level is longer, the voltage level of the boosted power supply 106 is greatly lowered because the charges are not supplied from the main boosted power supply generating circuit 103. For this reason, there is a possibility that a malfunction occurs to a circuit due to the restore of information in the XRAS cycle, the shortage of a write voltage and the shortage of a read voltage in the next XRAS cycle.

A second problem will be described below. When the potential limiting circuit 105 operates synchronously with the fall of XRAS, the charges are drawn from the boosted power supply 106 before the charges of the boosted power supply 106 are consumed by the rise of the word line. For this reason, when or after the word line rises, the charges should be supplied to the boosted power supply 106 again. Consequently, there is a possibility that useless power consumption is increased or the rising operation of the word line is delayed.

A third problem will be described below. When reading the data, the gate terminal of the NMOS transistor 185 of the output circuit 108 is boosted after the reading operation is determined and it is decided that the output data is High data. In addition, the boost circuit has a delay circuit. Consequently, it takes a long time to read the High data.

SUMMARY OF THE INVENTION

In consideration of the above problems, the present invention has the following objects.

It is a first object of the present invention to effectively prevent the malfunction of a circuit from occurring due to the shortage of the charges of a boosted power supply even if a period for which XRAS has the "L" level is longer.

It is a second object of the present invention to effectively prevent useless power consumption and the delay of the rising operation of a signal line caused when limiting the potential of the signal line for supplying the charges by the boosted power supply.

It is a third object of the present invention to increase the reading speed of High data.

In order to attain the first object, the present invention provides a first semiconductor integrated circuit comprising a controlled circuit portion on which active elements are provided, an internal boosted power supply connected to the active element to boost a signal inputted to the active element, and a boosted power supply generating circuit for supplying charges to the internal boosted power supply on receipt of an external signal which directs the active element of the controlled circuit portion to operate or stand by, wherein the boosted power supply generating circuit comprises at least one main boosted power supply generating circuit which operates synchronously with the external signal to supply a predetermined amount of charges to the internal boosted power supply when the external signal is in operation mode, an oscillating circuit for generating an oscillating signal, a sub-boosted power supply generating circuit which can supply, to the internal boosted power supply, an amount of charges corresponding to the frequency of an oscillating signal generated by the oscillating circuit on receipt of the oscillating signal, and supply capability switching means for switching the charge supply capability of the sub-boosted power supply generating circuit on receipt of the external signal so as to increase the charge supply capability when the external signal is in the operation mode as compared with the case of standby.

According to the above structure, when the period for which the active element of the controlled circuit is in the operation mode is long, the charges of the internal boosted power supply are consumed by the junction leak current and the off leak current of a lot of transistors or the like connected to the signal line which is connected to the active element. In that case, the supply capability switching means performs switching to increase the charge supply capability of the sub-boosted power supply generating circuit for continuously supplying the charges to the internal boosted power supply in the operation mode and to reduce the same capability in the standby mode. Accordingly, an amount of charges of the internal boosted power supply is not increased too much in the standby mode so that a drop in voltage level of the internal boosted power supply can be prevented from occurring even if the operation mode is continued for a long time. In other words, the malfunction of the circuit can be prevented from occurring due to the drop in voltage level of the internal boosted power supply.

More specifically, the supply capability switching means can have the following structures.

In the first semiconductor integrated circuit, the oscillating circuit can generate an oscillating signal having a first frequency and an oscillating signal having a second frequency which is higher than the first frequency, and the supply capability switching means is formed by a frequency switching circuit for controlling the oscillating circuit on receipt of the external signal so as to generate the oscillating signal having the first frequency when the external signal is in standby mode and the oscillating signal having the second frequency when the external signal is in operation mode.

In the first semiconductor integrated circuit, the oscillating circuit comprises a first oscillating circuit for generating an oscillating signal having a first frequency and a second oscillating circuit for generating an oscillating signal having a second frequency which is higher than the first frequency, and the supply capability switching means is formed by a frequency switching circuit for performing switching on receipt of the external signal so as to input, to the sub-boosted power supply generating circuit, the oscillating signal of the first oscillating circuit when the external signal is in standby mode and the oscillating signal of the second oscillating circuit when the external signal is in operation mode.

In the first semiconductor integrated circuit, the sub-boosted power supply generating circuit comprises a plurality of sub-boosted power supply generating circuits in which capacitors for supplying charges to an internal boosted power supply are provided and have different capacities, and the supply capability switching means is a switching circuit which performs switching on receipt of the external signal so as to boost the internal boosted power supply by the sub-boosted power supply generating circuit in which the capacitor having the small capacitance is provided when the external signal is in the standby mode, and by the sub-boosted power supply generating circuit in which the capacitor having the great capacitance is provided when the external signal is in the operation mode.

In order to attain the first object, a second semiconductor integrated circuit according to the present invention comprises a controlled circuit portion (also referred to as a controlled circuit) on which active elements are provided, an internal boosted power supply connected to the active element to boost a signal inputted to the active element, and a boosted power supply generating circuit for supplying charges to the internal boosted power supply on receipt of an external signal which directs the active element of the controlled circuit portion to operate or stand by, wherein the boosted power supply generating circuit comprises at least one main boosted power supply generating circuit which operates synchronously with the external signal to supply a predetermined amount of charges to the internal boosted power supply when the external signal is in operation mode, an oscillating circuit for generating an oscillating signal, a sub-boosted power supply generating circuit which can supply, to the internal boosted power supply, an amount of charges corresponding to the frequency of an oscillating signal generated by the oscillating circuit on receipt of the oscillating signal, a level detecting circuit for detecting the voltage level of the internal boosted power supply, and supply capability switching means for switching the charge supply capability of the sub-boosted power supply generating circuit based on the voltage level of the boosted power supply which is detected by the level detecting circuit, and wherein the capability to supply charges to the boot power source is reduced when the voltage level of the boosted power supply is higher than a voltage level set by the level detecting circuit, and is increased when the voltage level of the boosted power supply is lower than the set voltage level. It is noted that the controlled circuit can be either a volatile memory such as a DRAM, a non-volatile memory such as an EEPROM, or a ferroelectric memory.

According to such a structure, the supply capability switching means performs control to increase the charge supply capability of the sub-boosted power supply generating circuit when the voltage level of the internal boosted power supply detected by the level detecting circuit is lowered. Consequently, the voltage level of the internal boosted power supply can be kept properly corresponding to the real voltage level of the internal boosted power supply. Accordingly, the malfunction of the circuit can be prevented from occurring due to a drop in voltage level of the internal boosted power supply.

According to the structure of the second semiconductor integrated circuit, the supply capability switching means can adopt the following preferred mode.

In the second semiconductor integrated circuit, the level detecting circuit comprises a first level detecting circuit for detecting that the voltage level of the internal boosted power supply is lower than a first set value, and a second level detecting circuit for detecting that the voltage level of the internal boosted power supply is lower than a second set value which is smaller than the first set value by a predetermined value, and the supply capability switching means performs switching on receipt of the outputs of the level detecting circuits so as to stop the supply of charges when the voltage level of the internal boosted power supply is higher than the first set value and to increase the charge supply capability when the voltage level of the internal boosted power supply is lower than the second set value, and performs switching to increase the charge supply capability when the voltage level of the internal boosted power supply is lower than the second set value.

In the second semiconductor integrated circuit, the oscillating circuit can generate an oscillating signal having a first frequency and an oscillating signal having a second frequency which is higher than the first frequency, and the supply capability switching means is formed by a frequency switching circuit for controlling the oscillating circuit on receipt of the detection signal of the level detecting circuit so as to generate the oscillating signal having the first frequency when the voltage level of the internal boosted power supply is lower than the first set value, and the oscillating signal having the second frequency when the voltage level of the internal boosted power supply is lower than the second set value.

In the second semiconductor integrated circuit, the oscillating circuit comprises a first oscillating circuit for generating an oscillating signal having a first frequency and a second oscillating circuit for generating an oscillating signal having a second frequency which is higher than the first frequency, and the supply capability switching means is formed by a frequency switching circuit for performing switching on receipt of the detection signal of the level detecting circuit so as to input, to the sub-boosted power supply generating circuit, the oscillating signal of the first oscillating circuit when the voltage level of the internal boosted power supply is lower than the first set value, and the oscillating signal of the second oscillating circuit when the voltage level of the internal boosted power supply is lower than the second set value.

In the second semiconductor integrated circuit, the sub-boosted power supply generating circuit comprises a plurality of sub-boosted power supply generating circuits in which capacitors for supplying charges to an internal boosted power supply are provided and have different capacities, and the supply capability switching means is a switching circuit which performs switching on receipt of the detection signal of the level detecting circuit so as to boost the internal boosted power supply by the sub-boosted power supply generating circuit in which the capacitor having the small capacitance is provided when the voltage level of the internal boosted power supply is lower than the first set value, and by the sub-boosted power supply generating circuit in which the capacitor having the great capacitance is provided when the voltage level of the internal boosted power supply is lower than the second set value.

In the first or second semiconductor integrated circuit, the controlled circuit is either a volatile memory such as a DRAM or a non-volatile memory such as an EEPROM or a ferroelectric memory, and the signal is inputted to a gate of the memory cell portion of the memory.

According to such a structure, the above functions can be obtained for the internal boosted power supply in the DRAM or the like. In this case, there is a possibility that the drop in voltage level of the internal boosted power supply is increased in the operation mode by the junction leak current and the off leak current of the transistor. However, the malfunction of the circuit and the like can be surely prevented from occurring due to the drop in voltage level of the internal boosted power supply.

In order to attain the second object, a third semiconductor integrated circuit according to the present invention comprises a controlled circuit portion on which active elements are provided, an internal boosted power supply connected to the active element to boost a signal inputted to the active element, and a boosted power supply generating circuit for supplying charges to the internal boosted power supply on receipt of an external signal which directs the active element of the controlled circuit portion to operate or stand by, wherein the boosted power supply generating circuit comprises at least one main boosted power supply generating circuit which operates synchronously with the external signal to supply a predetermined amount of charges to the internal boosted power supply when the external signal is in operation mode, an oscillating circuit for generating an oscillating signal, a sub-boosted power supply generating circuit for supplying an amount of charges corresponding to the frequency of an oscillating signal generated by the oscillating circuit on receipt of the oscillating signal, and potential limiting means for drawing the charges of the internal boosted power supply so as to limit the potential of the internal boosted power supply to the set level or less after a word line in said controlled circuit portion rises.

According to such a structure, when outputting data from the output circuit, the boosted power supply is utilized to boost the gate of the transistor to a boost power level before the output data is determined. Consequently, the reading speed of High data is increased. In addition, the charges are supplied from the main boosted power supply generating circuit to the boosted power supply synchronously with the fall of XCAS (XOE). Thus, the drop in boost voltage level which may be caused when boosting the gate of the output transistor can be completely prevented from occurring.

According to the third semiconductor integrated circuit, the potential limiting means can adopt the following preferred mode.

In the third semiconductor integrated circuit, the potential limiting means comprises a potential limiting circuit having the output side connected to the internal boosted power supply for drawing the charges of the internal boosted power supply on receipt of the external signal in operation mode, and a control circuit for performing control so as to input the external signal in the operation mode to the potential limiting circuit after a time for which the external signal is changed from the standby mode to the operation mode and the internal boosted power supply is lowered by power consumption in the active element of the controlled circuit portion passes.

The first or second semiconductor integrated circuit may further comprises potential limiting means for limiting the potential of the internal boosted power supply to the set level or less by drawing the charges of the internal boosted power supply after the potential of the signal is raised.

In order to attain the third object, a fourth semiconductor integrated circuit according to the present invention comprises a controlled circuit portion on which active elements are provided, an internal boosted power supply connected to the active element to boost a signal inputted to the active element, and a boosted power supply generating circuit for supplying charges to the internal boosted power supply on receipt of an external signal which directs data fetch from the controlled circuit portion, wherein the boosted power supply generating circuit comprises a control circuit for outputting an output determination signal for determining the output operation of the data from the controlled circuit in response to the external signal, an output circuit having a transistor controlled by the internal boosted power supply for outputting the output data to the outside on receipt of the output determination signal from the control circuit, and a main boosted power supply generating circuit having the output side connected to the internal boosted power supply and the output circuit for supplying charges to the gate of the transistor of the output circuit and the internal boosted power supply on receipt of the enable signal of the control circuit.

According to such a structure, when outputting the data from the output circuit, the boosted power supply is utilized to boost the gate of the transistor to a boost voltage level before the output data is determined. Consequently, the reading speed or High data is increased. In addition, the charges are supplied from the main boosted power supply generating circuit to the boosted power supply synchronously with the fall of XCAS (or XOE). Thus, the drop in voltage level of the boosted power supply which may be caused when boosting the gate of the output transistor can be completely prevented from occurring.

In the fourth semiconductor integrated circuit, the boosted power supply generating circuit can adopt the following preferred mode.

In the fourth semiconductor integrated circuit, the boosted power supply generating circuit operates synchronously with the fall of a column address strobe signal (XCAS) or an output enable signal (XOE) from the "H" level to the "L" level, and supplies charges to the internal boosted power supply.

In the fourth semiconductor integrated circuit, the boosted power supply generating circuit operates synchronously with the fall of XCAS or XOE from the "H" level to the "L" level when a write enable signal (XWE) has the "H" level, and supplies charges to the internal boosted power supply.

In the fourth semiconductor integrated circuit, the boosted power supply generating circuit supplies the charges to the internal boosted power supply only when outputting the High data.

According to such a structure, the main boosted power supply generating circuit does not operate even if a read enable signal is outputted when outputting Low data, that is, in the state where a bias transistor is kept OFF. Accordingly, useless power consumption can be avoided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a timing chart of an XRAS signal and a control signal according to the third example;

DETAILED DESCRIPTION OF THE INVENTION

Each example of the present invention will be described below.

(First Example)

Figure 13:
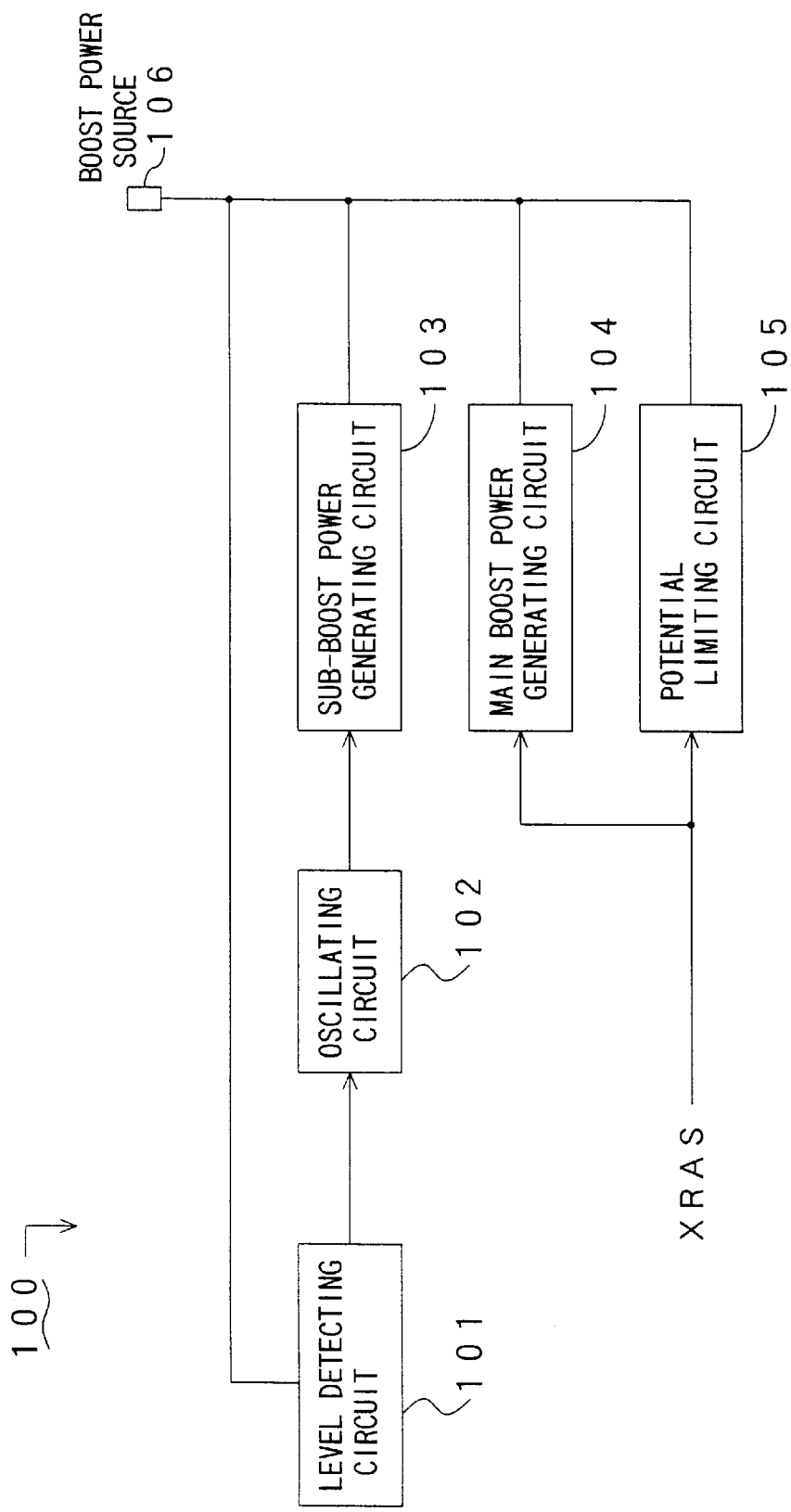
FIG. 13 is a block diagram showing the overall structure of a boosted power supply generating circuit according to the prior art.
Figure 1:
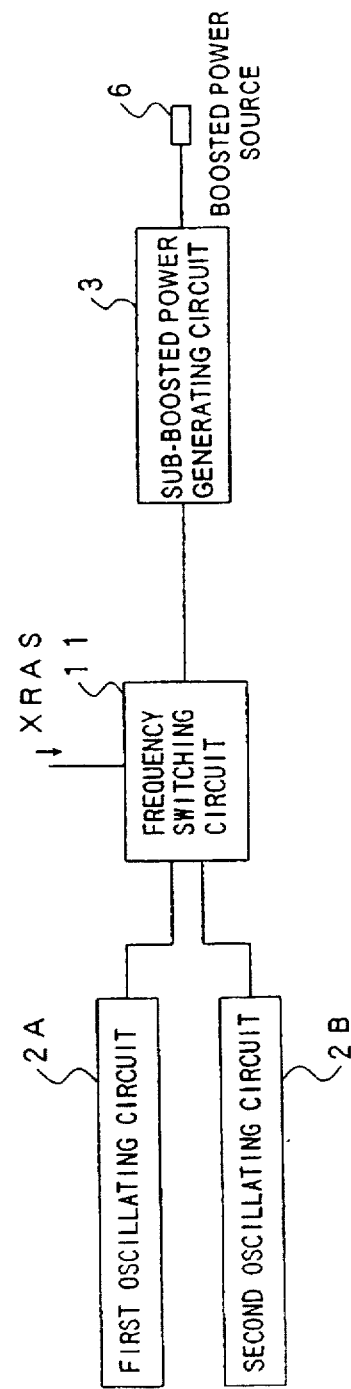
FIG. 1 is a block diagram showing the structure of a part of a boosted power supply generating circuit according to a first example.
Figure 2:
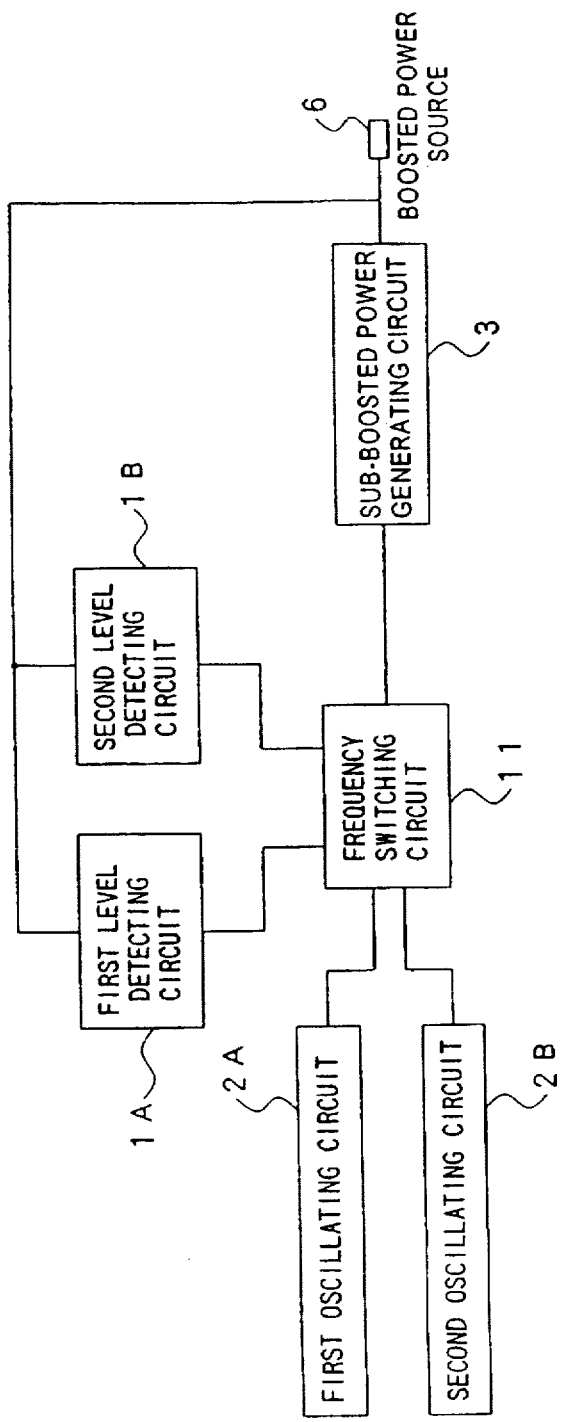
Figure 5:
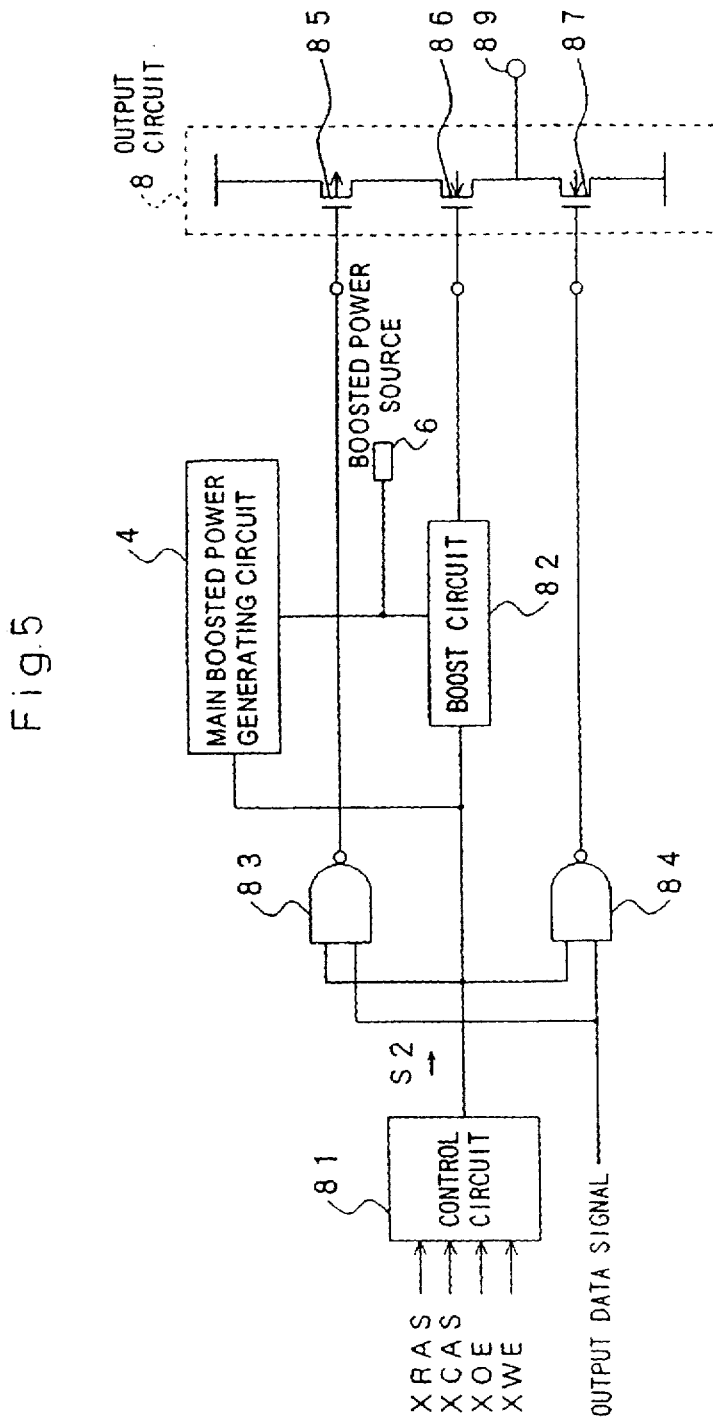
Figure 8:
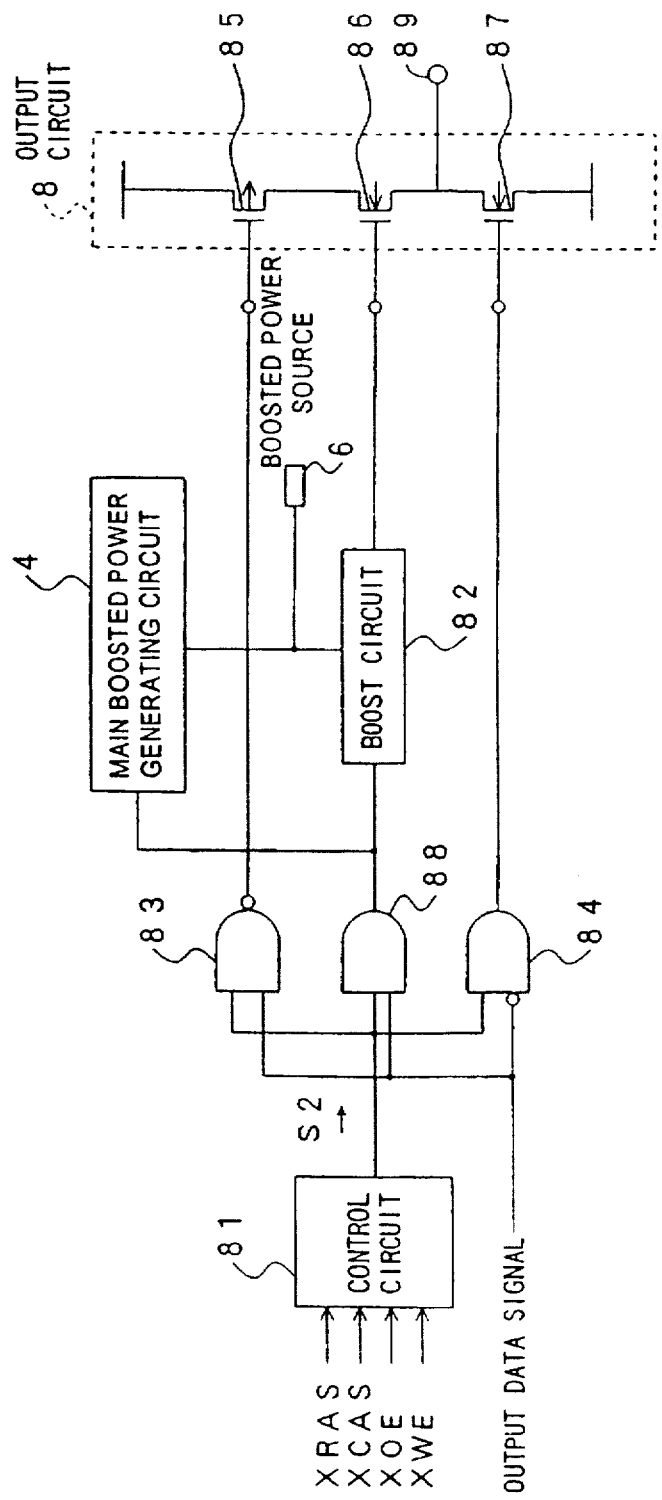
Figure 9:
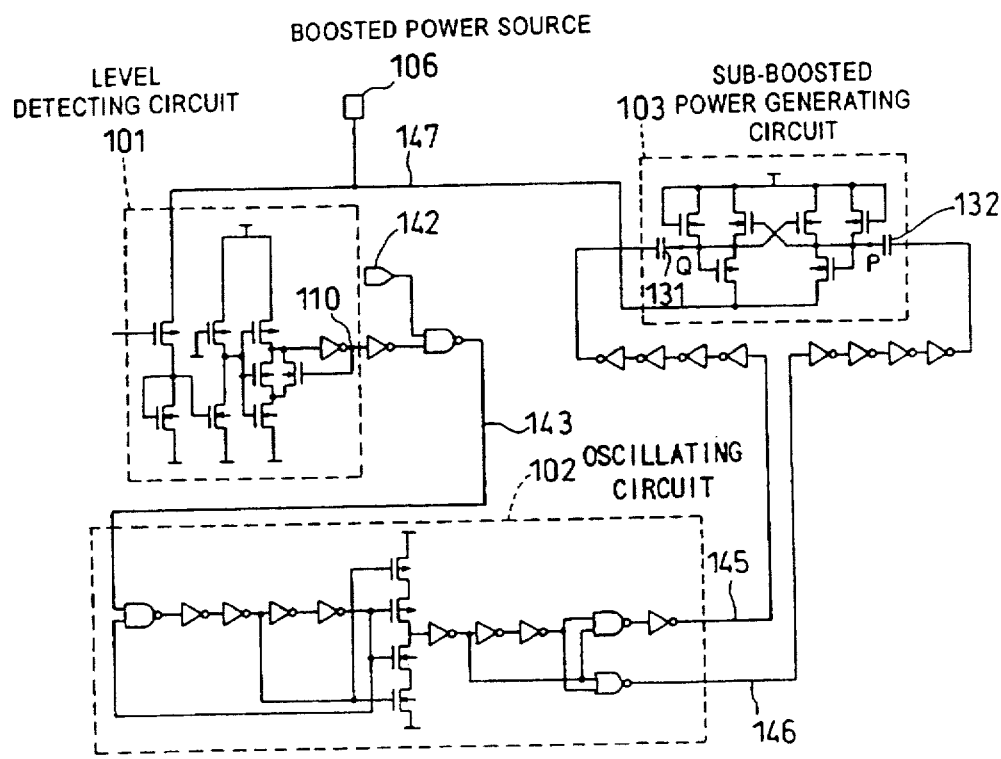
FIG. 9 is an electric circuit diagram showing a sub-boosted power supply generating circuit according to the prior art.
Figure 13:
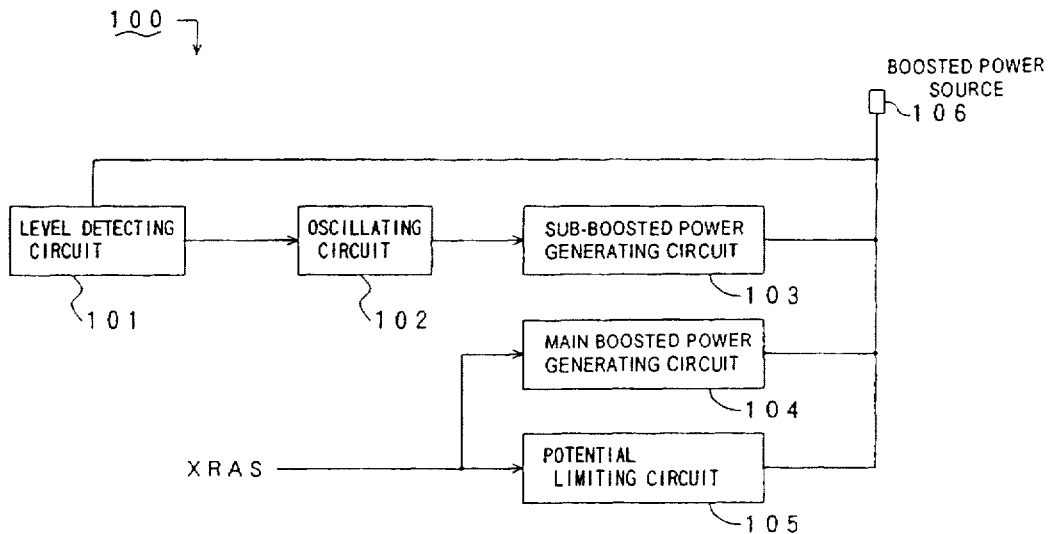

FIG. 1 is a block diagram showing a part of a boosted power supply generating circuit according to the first example. The basic structure of the boosted power supply generating circuit is almost the same as that of FIG. 13 according to the prior art described above. As shown in FIG. 1, first and second oscillating circuits 2A and 2B having oscillating frequencies f1 and f2 which are different from each other are provided. In addition, a frequency switching circuit 11 for switching to conduct only one of the outputs of the oscillating circuits 2A and 2B on receipt thereof according to the signal state of XRAS is provided. The input side of a sub-boosted power supply generating circuit 3 is connected to the output side of the frequency switching circuit 11. A boosted power supply 6 is connected to the output side of the sub-boosted power supply generating circuit 3. More specifically, the operation and non-operation of the sub-boosted power supply generating circuit 3 are controlled by the output signal of the frequency switching circuit 11 which is controlled by XRAS. f2>f1 is preset.

The operation of the boosted power supply generating circuit having the above structure will be described below.

When XRAS has the "H" level, that is, during standby, the output of the first oscillating circuit 2A is selected by the frequency switching circuit 11. A signal having an oscillating frequency f1 is input to the sub-boosted power supply generating circuit 3. The sub-boosted power supply generating circuit 3 operates at the oscillating frequency f1 to supply a predetermined amount of charges to the boosted power supply 6. Consequently, the voltage level of the boosted power supply 6 is boosted. During this standby, it is sufficient that the proper voltage level of the boosted power supply 6 is held. For this reason, the great charge supply capability of the sub-boosted power supply generating circuit 3 is not required. Consequently, power consumption can be reduced.

When XRAS has the "L" level, that is, during operation, the output of the second oscillating circuit 2B is selected by the frequency switching circuit 11. A signal having the oscillating frequency f2 is input to the sub-boosted power supply generating circuit 3. The sub-boosted power supply generating circuit 3 operates at the oscillating frequency f2 to supply a second amount of charges to the boosted power supply 6. Consequently, the voltage level of the boosted power supply 6 is boosted. In this case, f1<f2 is set. For this reason, the amount of charges supplied from the sub-boosted power supply generating circuit 3 is greater than the amount of charges supplied during standby. Thus, even if a period for which XRAS has the "L" level is longer, the sub-boosted power supply generating circuit 3 is caused to operate in a short cycle to supply a large amount of charges to the boosted power supply 6. Consequently, a drop in voltage level of the boosted power supply 6 caused by a transistor off leak current and a junction leak current can be controlled so that the malfunction of the circuit can be prevented from occurring due to the drop in voltage level of the boosted power supply 6.

While a frequency at which the sub-boosted power supply generating circuit 3 is driven is switched during the standby and the operation of a DRAM so that the charge supply capabilities obtained during the standby and the operation are switched to control a drop in voltage level of the boosted power supply during the operation in the present example, other switching methods can be adopted. For example, two sub-boosted power supply generating circuits in which capacitors for supplying charges to the boosted power supply 6 have different capacities are provided and switching is performed so as to supply the charges from either of the sub-boosted power supply generating circuits to the boosted power supply 6 during the standby and the operation. Consequently, the same effects as those of the present example can be obtained.

Furthermore, the present invention can be applied to a boosted power supply generating circuit connected to the signal lines of various kinds of semiconductor integrated circuits as well as a boosted power supply generating circuit connected to the word line of the DRAM.

(Second Example)

Figure 2:
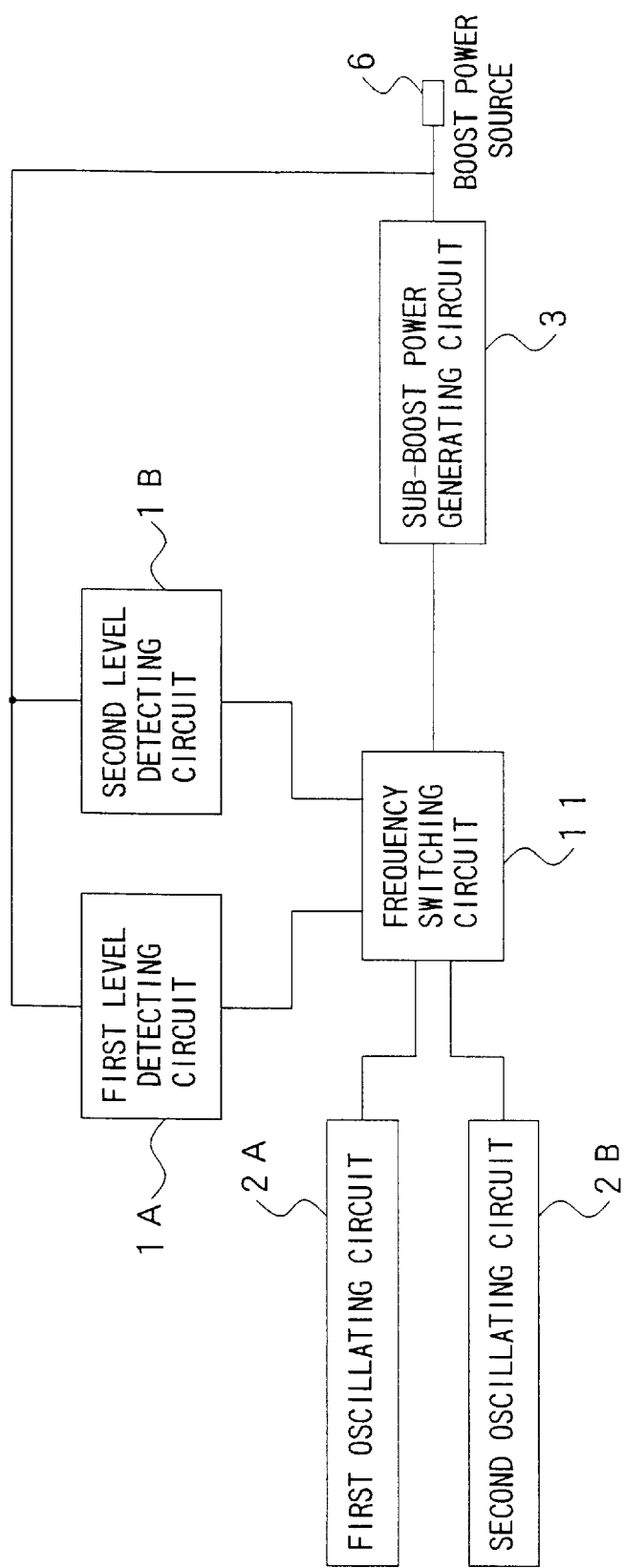
FIG. 2 is a block diagram showing the structure of a part of a boosted power supply generating circuit according to a second example.

A second example will be described below. FIG. 2 is a block diagram showing the structure of a part of a boosted power supply generating circuit according to the second example. As shown in FIG. 2, the present example differs from the first example shown in FIG. 1 in that the frequency switching circuit 11 is not controlled by XRAS but by the outputs of first and second level detecting circuits 1A and 1B. The level detecting circuit 1A and 1B detect the level of a boosted power supply 6. A detection level V1 of the first level detecting circuit 1A is set higher than a detection level V2 of the second level detecting circuit 1B. In other words, V1>V2 is set. The relationship between oscillating frequencies f1 and f2 of oscillating circuits 2A and 2B is the same as in the first example.

If the voltage level of the boosted power supply 6 is lower than the detection level V1 of the first level detecting circuit 1A, a sub-boosted power supply generating circuit 3 is driven at the frequency f1 to supply a small amount of charges to the boosted power supply 6. Consequently, the voltage level of the boosted power supply 6 is boosted a little. If the voltage level of the boosted power supply 6 is lower than the detection level V2 of the second level detecting circuit 1B, the sub-boosted power supply generating circuit 3 is driven at the frequency f2 to supply a large amount of charges to the boosted power supply 6. Consequently, the voltage level of the boosted power supply 6 is boosted greatly.

When the voltage level of the boosted power supply 6 is lower than the detection level V2 of the second level detecting circuit 1B, that is, power consumption in the circuit is great so that the voltage level of the boosted power supply 6 is lowered considerably, the sub-boosted power supply generating circuit 3 is driven in a short cycle. Consequently, it is possible to effectively prevent the malfunction of the circuit and the like from occurring due to a drop in voltage level of the boosted power supply 6. According to the present example, the amount of supplied charges is controlled corresponding to the real voltage level of the boosted power supply 6 so that the malfunction of the circuit and the like can be prevented more surely than in the first example.

While a frequency at which the sub-boosted power supply generating circuit 3 is driven is switched during the standby and the operation of a DRAM so that the charge supply capabilities obtained during the standby and the operation are switched to control a drop in voltage level of the boosted power supply during the operation in the present example, other methods can be adopted. For example, two subboosted power supply generating circuits in which capacitors for supplying charges to the boosted power supply 6 have different capacities are provided and switching is performed so as to supply the charges from either of the sub-boosted power supply generating circuits to the boosted power supply 6 during the standby and the operation. Consequently, the same effects as those of the present example can be obtained.

Furthermore, the present invention can be applied to a boosted power supply generating circuit connected to the signal lines of various kinds of semiconductor integrated circuits as well as a boosted power supply generating circuit connected to the word line of the DRAM.

(Third Example)

Figure 3:
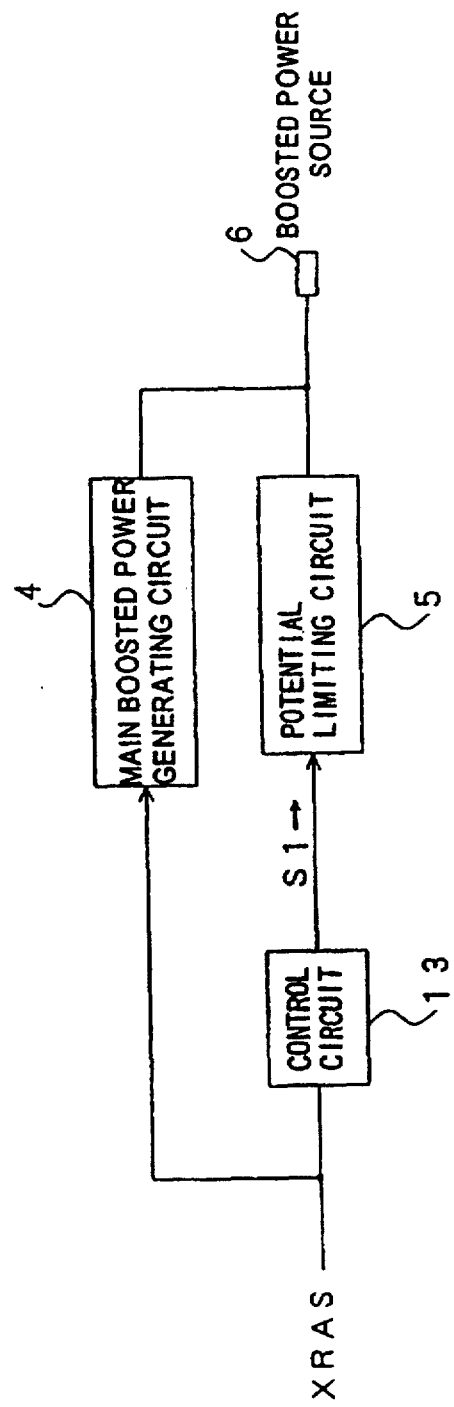
FIG. 3 is a block diagram showing the structure of a part of a boosted power supply generating circuit according to a third example.
Figure 8:
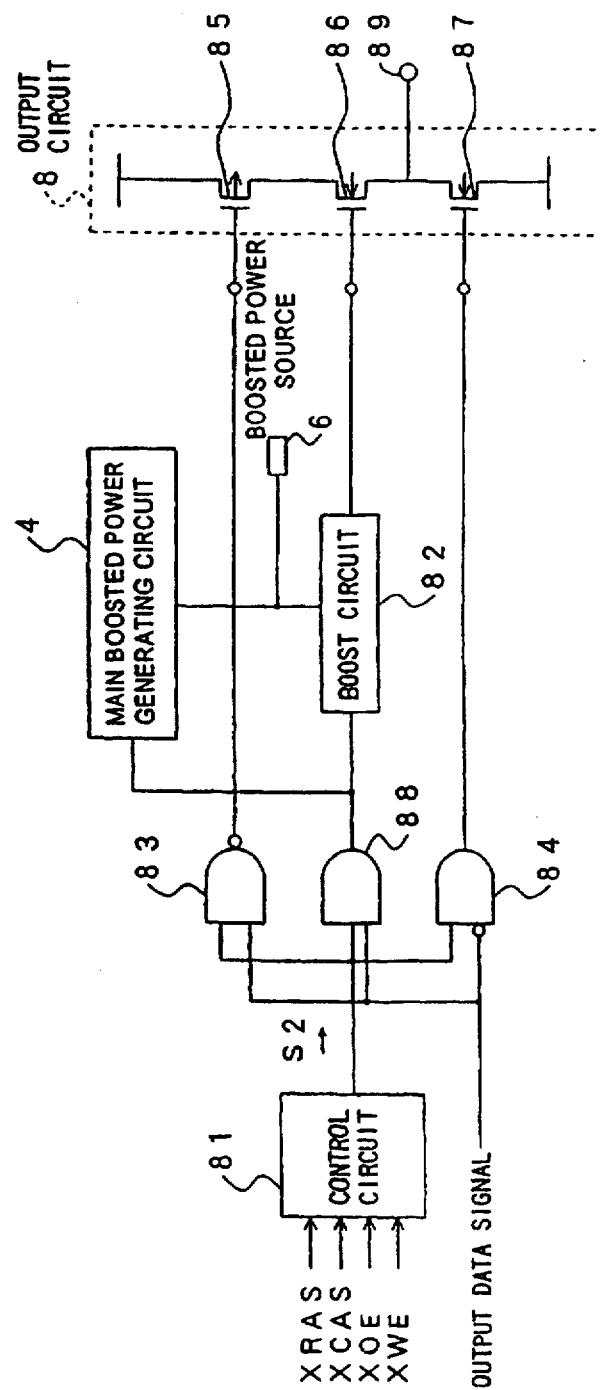
Figure 9:
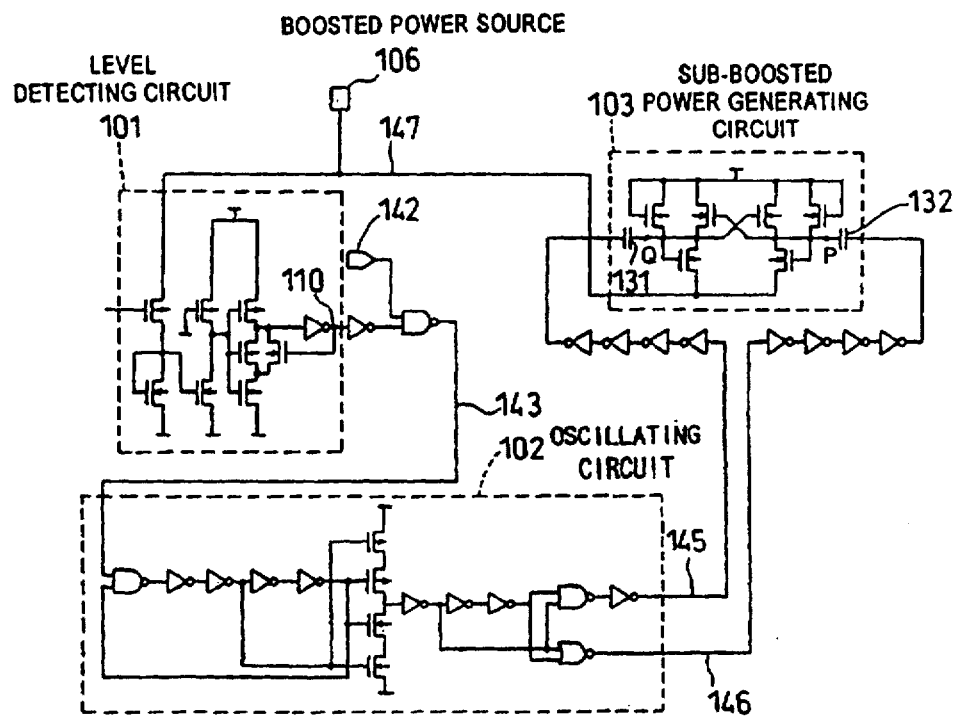
Figure 10:
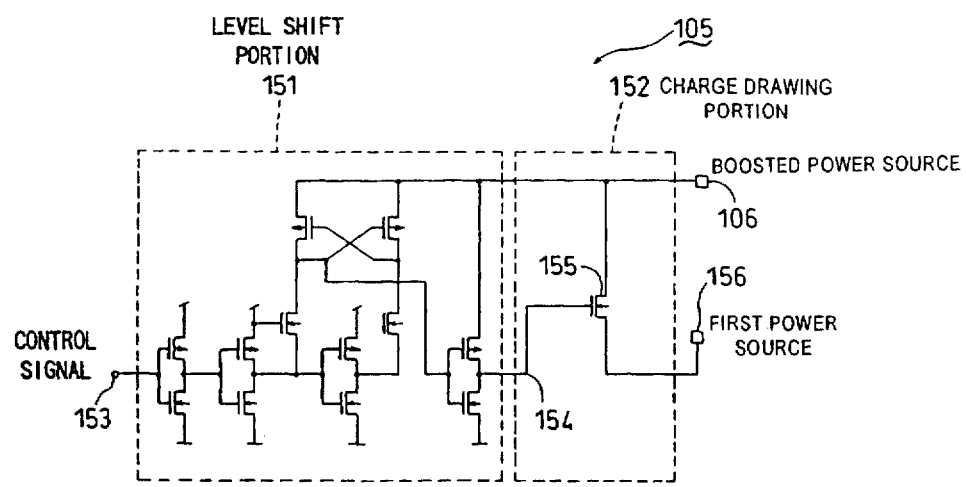
Figure 13:
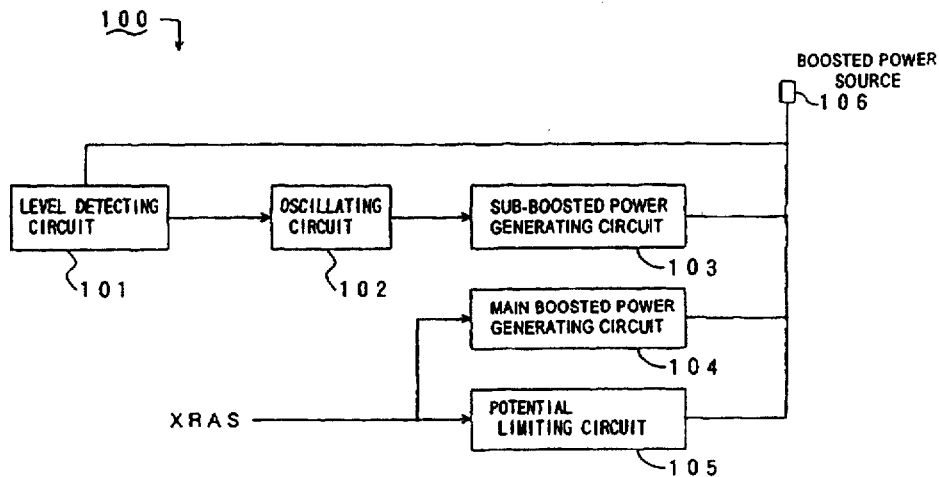

A third example will be described below. FIG. 3 is a block diagram showing the structure of a part of a boosted power supply generating circuit according to the present example. FIG. 4 is a timing chart showing the timing relationship between a control signal and XRAS according to the present example.

Figure 10:
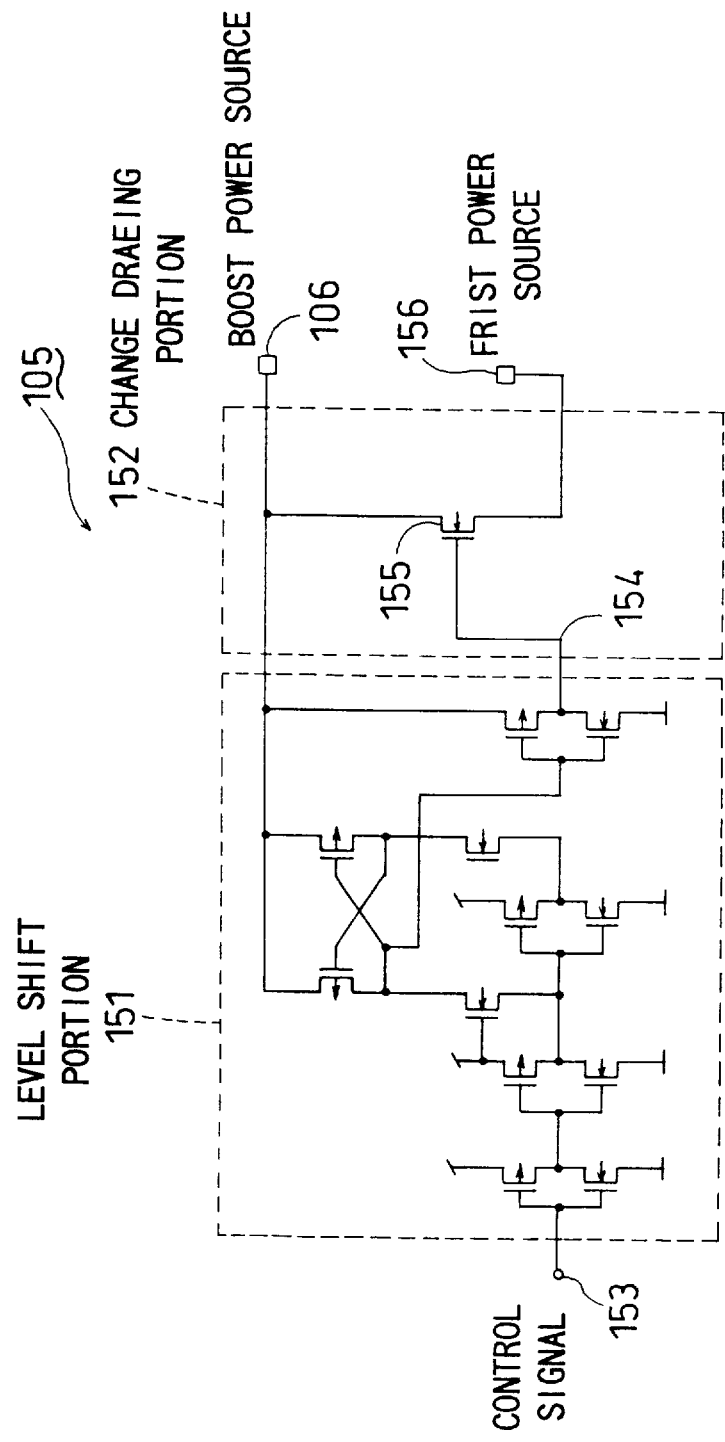
FIG. 10 is an electric circuit diagram showing a potential limiting circuit according to the prior art.

According to the present example, a control circuit 13 for controlling the timing of XRAS input to a potential limiting circuit 5 is provided in addition to a main boosted power supply generating circuit 4 for supplying charges to a boosted power supply 6 and a potential limiting circuit 5 for drawing the charges of the main boosted power supply generating circuit 4 to limit the voltage level of the boosted power supply 6. More specifically, the operation of the main boosted power supply generating circuit 4 is controlled by XRAS and the operation of the potential limiting circuit 5 is controlled by a control signal S1 output from the control circuit 13. The control circuit 13 inputs XRAS shown in FIG. 4 and outputs the control signal S1 which is equivalent to XRAS delayed by a constant time DT. In other words, the control signal S1 is changed to the "L" level when a predetermined time DT passes after XRAS is set to the "L" level. The structure of the potential limiting circuit 5 itself is basically the same as that of the potential limiting circuit 105 shown in FIG. 10.

The operation of the boosted power supply generating circuit having the above structure will be described below with reference to FIGS. 3 and 4.

When XRAS has the "H" level, that is, during standby, the main boosted power supply generating circuit 4 and the potential limiting circuit 5 are kept in the operation stop state. When XRAS is changed from the "H" level to the "L" level, the main boosted power supply generating circuit 4 operates to supply charges to the boosted power supply 6. Consequently, the voltage level of the boosted power supply 6 is boosted. The potential limiting circuit 5 operates by the control signal S1 when the predetermined time DT passes after the main boosted power supply generating circuit 4 operates. If the voltage level of the boosted power supply 6 is higher than a set level, the charges are drawn so that the voltage level of the boosted power supply 6 is reduced to the set level.

If the rise time of a word line which consumes the charges of the boosted power supply 6 is estimated to preset the delay time DT of the control circuit 13, the potential limiting circuit 5 operates after the word line rises so that the charges of the boosted power supply 6 can be drawn. According to the present example, it is not necessary to drive the main boosted power supply generating circuit 4 again when or after the word line rises. Accordingly, the rise speed of the word line can be increased. In addition, useless charge consumption can be controlled so that power consumption can be reduced.

(Fourth Example)

Figure 5:
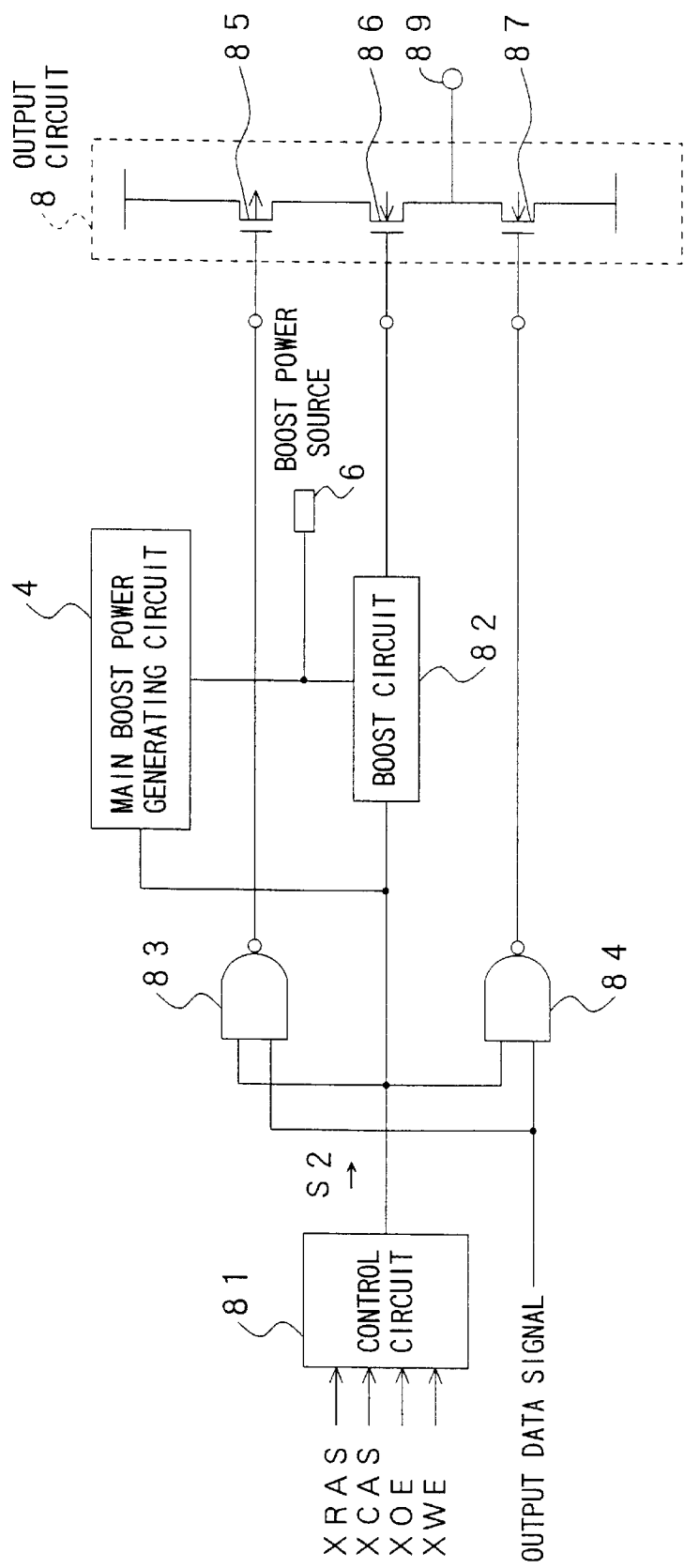
FIG. 5 is a block diagram showing the structure of a part of a boosted power supply generating circuit according to a fourth example.
Figure 6:
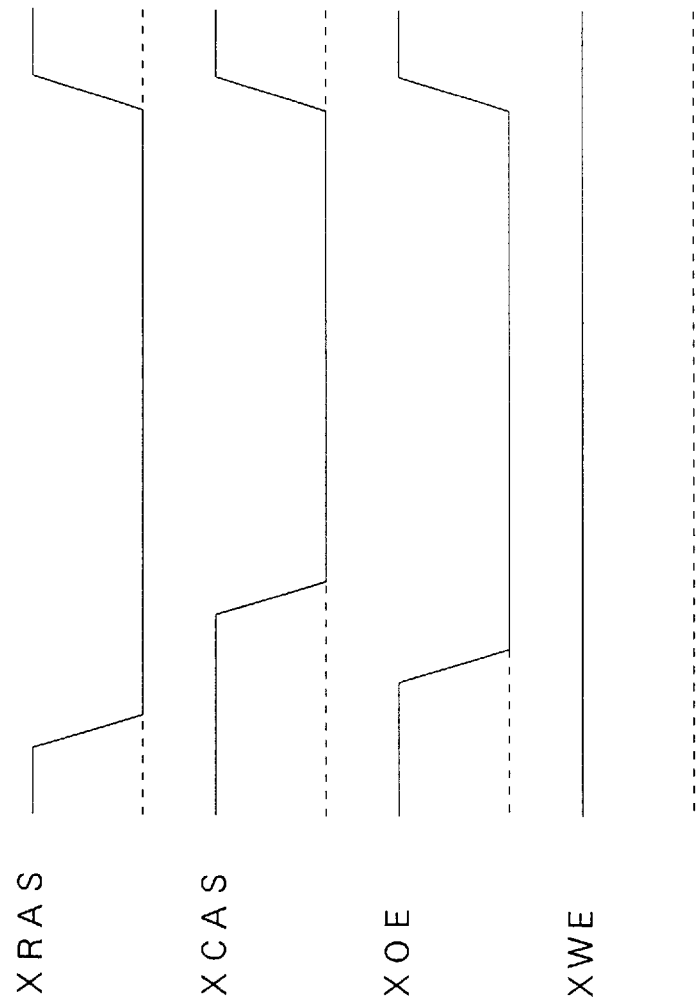
FIG. 6 is a timing chart of a signal input to a control circuit according to the fourth example.
Figure 7:
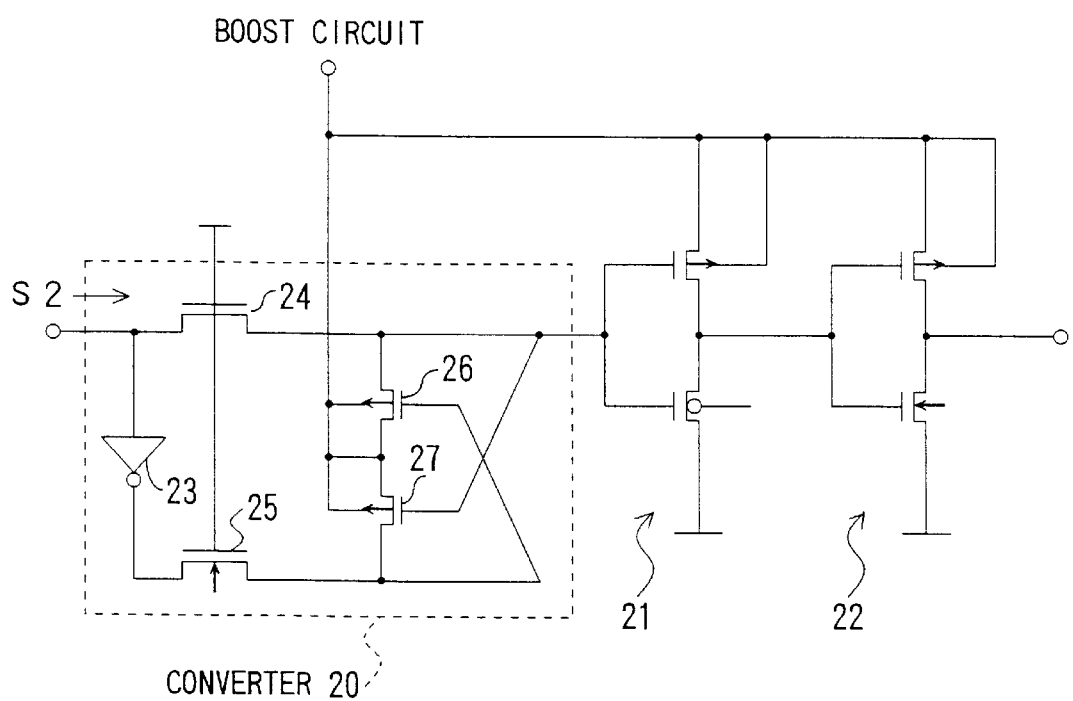
FIG. 7 is an electric circuit diagram showing a boost circuit according to the fourth example.

A fourth example will be described below. FIG. 5 is a block diagram showing the structure of a circuit which is provided on the output side of a DRAM according to the fourth example. FIG. 7 is a circuit diagram showing the structure of the boost circuit in FIG. 5. FIG. 6 is a timing chart showing the timing relationship between signals.

Figure 11:
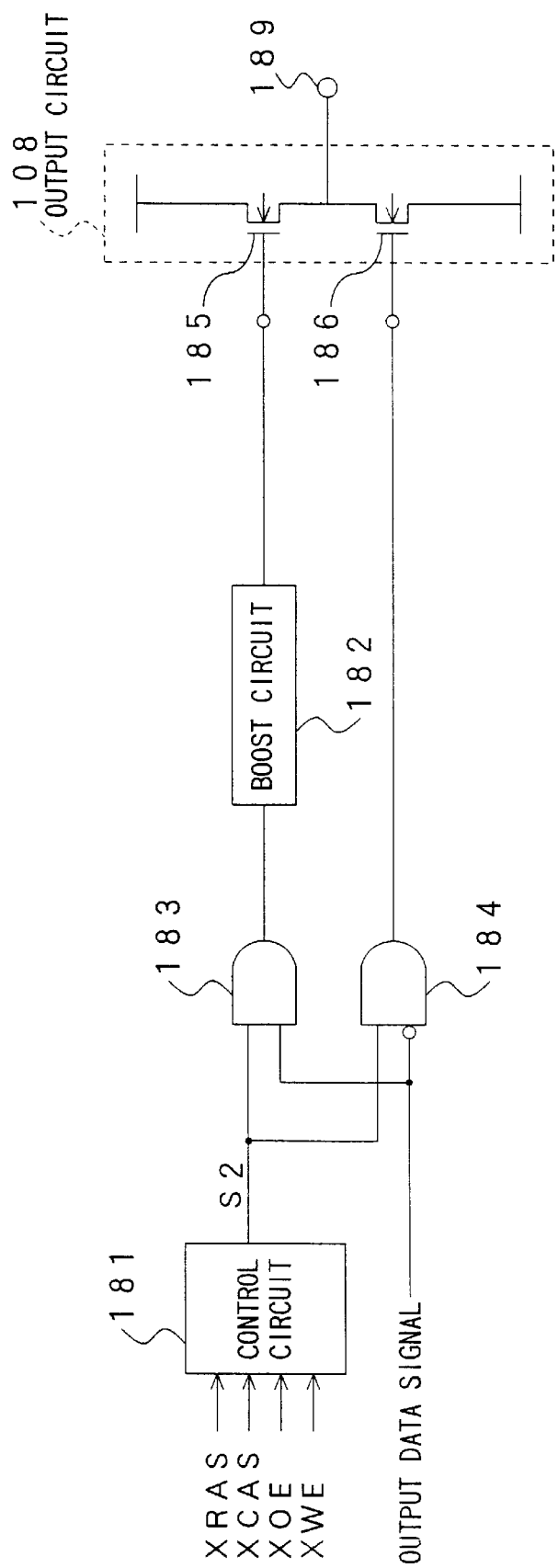
FIG. 11 is an electric circuit diagram showing an output circuit according to the prior art.

As shown in FIG. 5, the circuit structure according to the present example differs from the circuit structure according to the prior art shown in FIG. 11 in that a boost circuit 82 is connected to a boosted power supply 6. An output circuit 8 is provided on the output side of the boost circuit 82. A control circuit 81 for outputting a control signal S2 on receipt of XRAS, XCAS, XOE and XWE, a NAND circuit 83 for executing the NAND operation of the control signal S2 and an output data signal, and an AND circuit 84 for executing the AND operation of the control signal S2 and the inverted output data signal are provided on the input side of the boost circuit 82. A PMOS transistor 85 and NMOS transistors 86 and 87 connected between a first power source and a ground power source in series are provided in the output circuit 8. Data is output from a signal line provided between the NMOS transistors 86 and 87 through an output terminal 89. The gate of the PMOS transistor 85 is connected to the output side of the NAND circuit 83. The gate of the NMOS transistor 86 is connected to the output side of the boost circuit 82. The gate of the NMOS transistor 87 is connected to the output side of the AND circuit 84. The operation of the main boosted power supply generating circuit 4 is controlled by the output of the control circuit 81.

Figure 12:
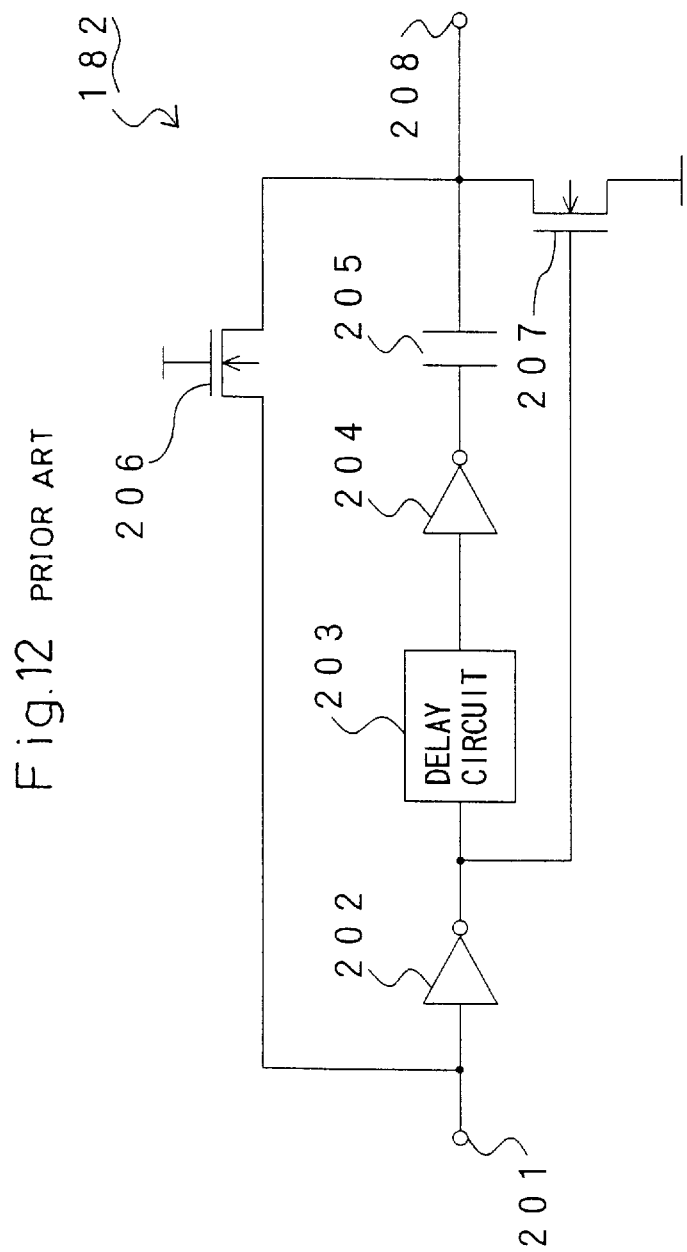
FIG. 12 is an electric circuit diagram showing a boost circuit according to the prior art.

As shown in FIG. 7, a control signal S2 which is the output of the control circuit 81 is sent to the input terminal of the boost circuit 82. The input terminal is connected to an output terminal through a converter 20, a first inverter 21 and a second inverter 22. The converter 20 is formed by an inverter 23, NMOS transistors 24 and 25, and PMOS transistors 26 and 27. According to the boost circuit 82, when the input signal has the "H" level, the output signal is set to a higher boost level than that of the input signal by using the boosted power supply. In addition, a delay circuit is not required unlike the structure shown in FIG. 12. For this reason, the output signal is changed from the "L" level to the "H" level at a high speed in response to the transition of the input signal from the "L" level to the "H" level.

In the circuit having the above structure according to the present example, when the data reading operation is determined by the timings of XRAS, XCAS, XOE and XWE, the main boosted power supply generating circuit 4 is driven to supply charges to the boosted power supply 6. Consequently, the voltage level of the boosted power supply 6 is boosted, and the boost circuit 82 performs control so as to set the gate of the NMOS transistor 86 to a boost voltage supplied from the main boosted power supply generating circuit 4. As shown in FIG. 6, XRAS, XCAS and XOE have the "L" level and XWE has the "H" level during the data reading operation.

While the main boosted power supply generating circuit is connected to the boost circuit through the boosted power supply in the prior art, the main boosted power supply generating circuit 4, together with the boosted power supply 6, is directly connected to the boost circuit 82 in the present example. After data reading is determined, the main boosted power supply generating circuit 4 is driven synchronously with the fall of XCAS before the output data is determined. The gate of the NMOS transistor 86 is set to a boost voltage so that the NMOS transistor 86 is turned ON by the control of the boost circuit 82. The PMOS transistor 85 is turned ON by the NAND circuit 83 and the NMOS transistor 87 is turned OFF by the AND circuit 84. Consequently, High data is input to the output terminal 89.

In the circuit according to the prior art, the gate of the NMOS transistor is set to a boost voltage by the boost circuit after the reading operation is determined and the output data is determined, and a delay circuit is necessary for the boost circuit. Consequently, it takes a long time to read the High data.

According to the present example, the gate of the NMOS transistor 86 is boosted by using the boosted power supply before the output data is determined. Consequently, the reading speed of the High data can be increased. When boosting the gate of the NMOS transistor 86, it is concerned that the voltage level of the boosted power supply 6 is lowered because the data capacity of the NMOS transistor 86 is great. However, the main boosted power supply generating circuit 4 is driven synchronously with the fall of XCAS to supply the charges to the boosted power supply 6. Consequently, a drop in voltage level of the boosted power supply 6 can be prevented from occurring.

According to the fourth example, the main boosted power supply generating circuit 4 is driven synchronously with the fall of XCAS after the data reading operation is determined so that the voltage level of the boosted power supply 6 is boosted. It is sufficient that the gate of the NMOS transistor 86 is set to the boost voltage before data output. Consequently, the main boosted power supply generating circuit 4 may be driven synchronously with the fall of XOE.

(Fifth Example)

Figure 8:
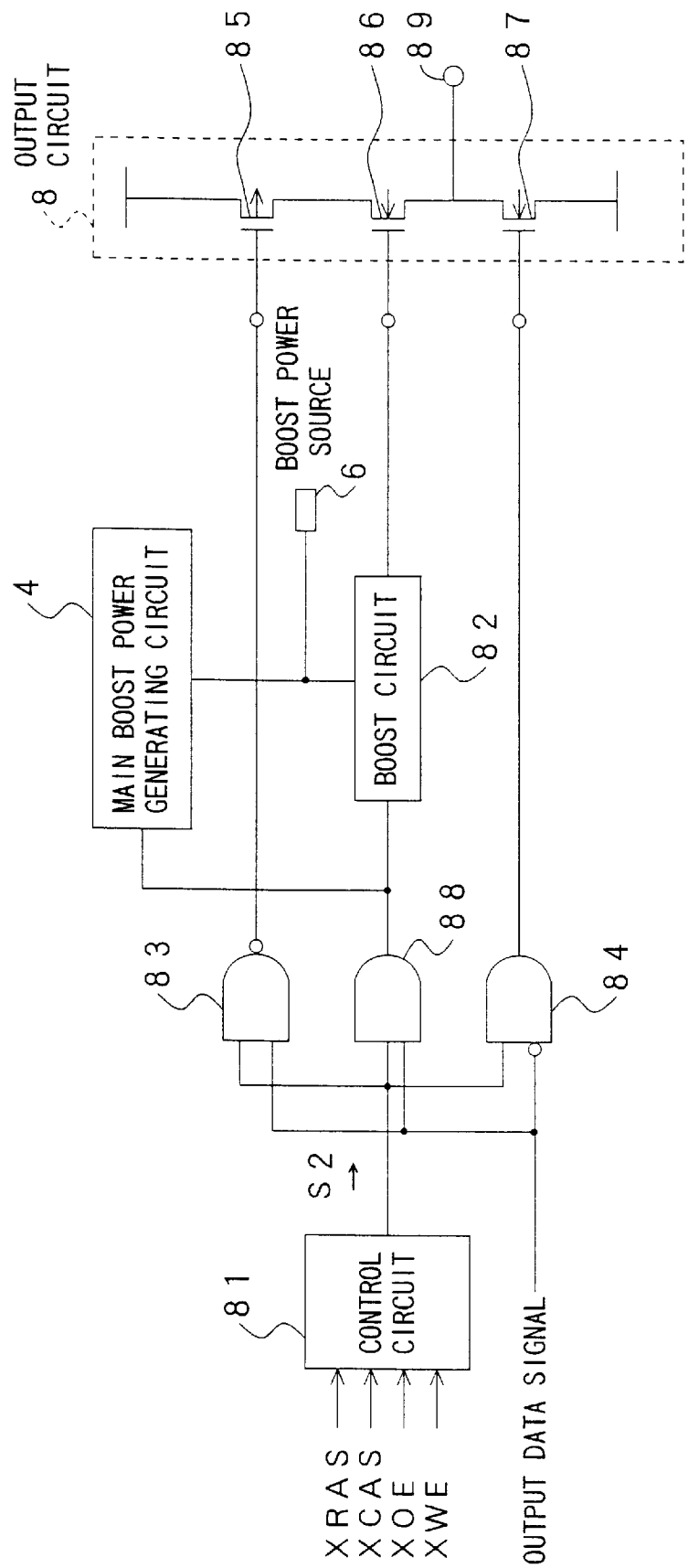
FIG. 8 is a block diagram showing the structure of a part of a boosted power supply generating circuit according to a fifth example.

A fifth example will be described below. FIG. 8 is a block diagram showing the structure of a circuit provided on the output side of a DRAM according to the fifth example. The structure of the circuit according to the present example is almost the same as that of the circuit according to the fourth example shown in FIG. 5 except that an AND circuit 88 for executing the AND operation of an output data signal and a control signal S2 is provided between a control circuit 81 and a boost circuit 82 so that the output of the AND circuit 88 is input to a main boosted power supply generating circuit 4 and the boost circuit 82.

According to the present example, the main boosted power supply generating circuit 4 and the boost circuit 82 are controlled by the AND circuit 88. Consequently, an NMOS transistor 86 is not turned ON when only the data reading operation is determined. Only when the data reading operation is determined and the output data is High data, the gate of the NMOS transistor 86 is set to a boost voltage so that the NMOS transistor 86 is turned ON. According to the fourth example, also in the case where the output data signal has the "L" level, the NMOS transistor 86 is turned ON when the reading operation is determined.

According to the present example, the malfunction of the circuit can be prevented from occurring similarly to the fourth example. In addition, it is sufficient that the main boosted power supply generating circuit 4 is driven only when reading the High data. Consequently, power consumption can be reduced.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

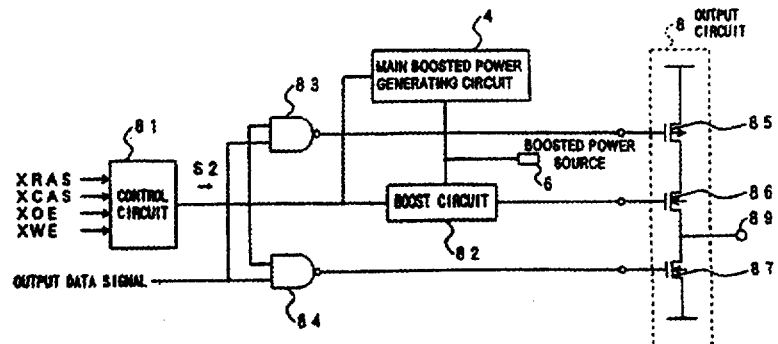

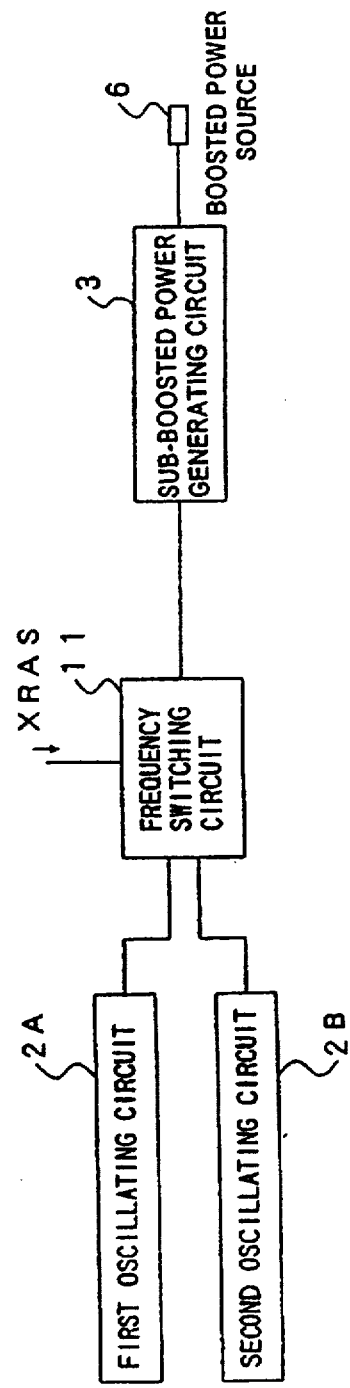

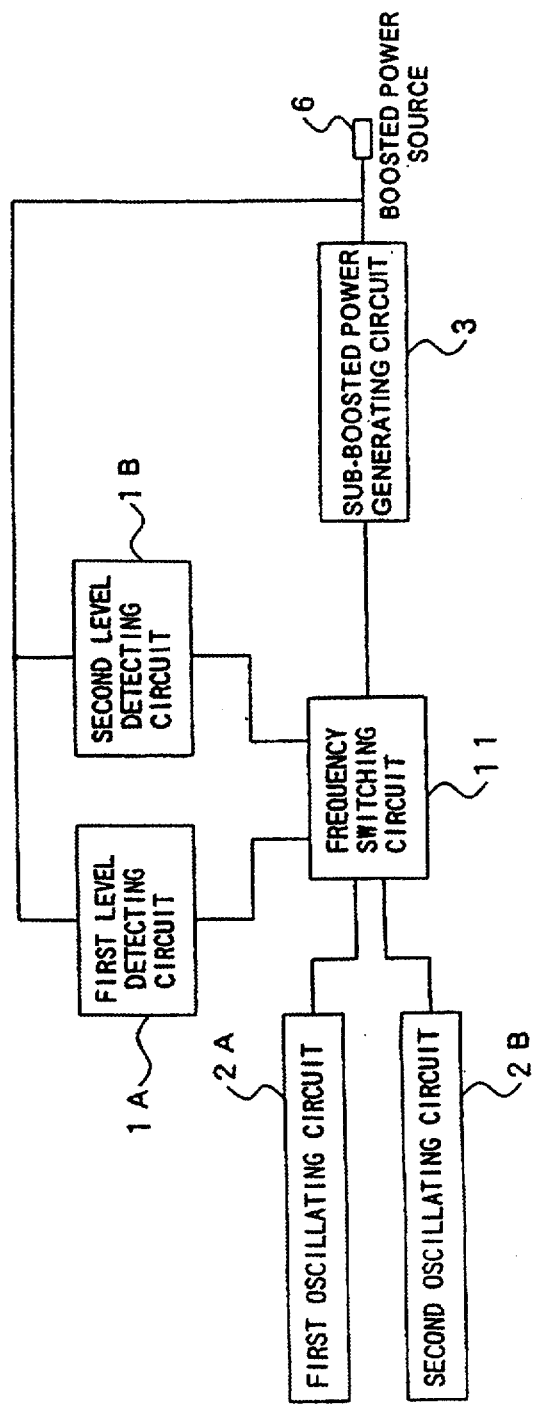

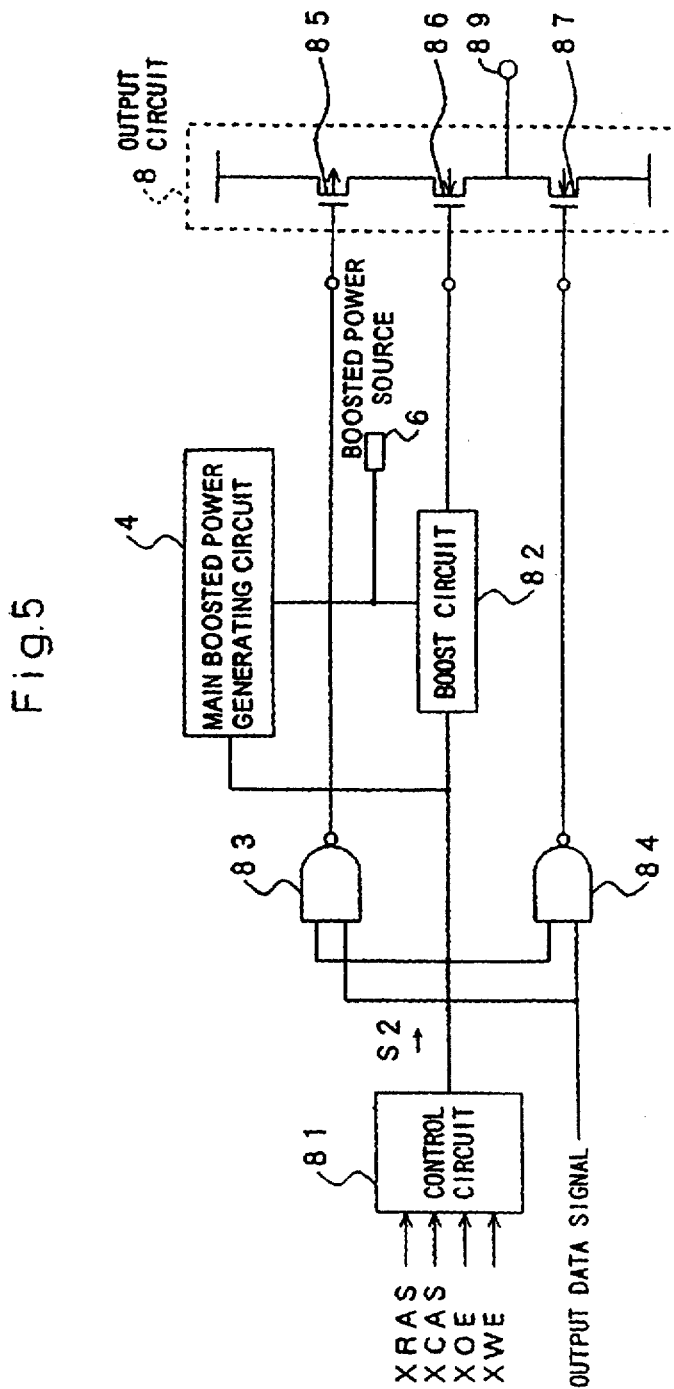

We claim:

1. A semiconductor integrated circuit comprising:
   a controlled circuit having a plurality of memory cells, each of said plurality of memory cells comprising a MOSFET having a gate electrode;
   an internal boosted power supply node for boosting a signal input to a word line, said word line coupled to the gate electrode of the MOSFET of each of the plurality of memory cells; and
   a boosted power supply generating circuit for supplying charge to the internal boosted power supply node upon receipt of an external signal having an operation mode directing the controlled circuit to operate and a stand-by mode directing the controlled circuit to stand-by;
   wherein said boosted power supply generating circuit comprises:
      at least one main boosted power supply generating circuit coupled to the internal boosted power supply node, for synchronously operating with the external signal, when the external signal is switched from a stand-by mode to an operation mode, to supply a predetermined amount of charge to the internal boosted power supply node;
      an oscillating circuit for generating a first oscillating signal having a first frequency and a second oscillating signal having a second frequency which is higher than said first frequency;
      a sub-boosted power supply generating circuit coupled to an output of the oscillating circuit and the internal boosted power supply node, said sub-boosted power supply generating circuit operative for generating a first charge level and a second charge level, said first charge level being larger than said second charge level, said first charge level and said second charge level corresponding to said first oscillating signal and said second oscillating signal, respectively; and
      charge supply capability control means for controlling the sub-boosted power supply generating circuit upon receipt of the external signal so that the sub-boosted power supply generating circuit continuously supplies the first charge level to the internal boosted power supply node when the external signal is in said operating mode, and continuously supplies the second charge level to the internal boosted power supply node when the external signal is in said stand-by mode.

2. The semiconductor integrated circuit of claim 1, wherein
   said charge supply capability control means comprises a frequency switching circuit for controlling said oscillating circuit upon receipt of said external signal so as to generate said oscillating signal having the first frequency when said external signal is in operation mode and said oscillating signal having the second frequency when said external signal is in standby mode.

3. The semiconductor integrated circuit of claim 2, wherein said oscillating circuit comprises a first oscillating circuit for generating said oscillating signal having said first frequency and a second oscillating circuit for generating said oscillating signal having said second frequency which is higher than said first frequency, and
   said charge supply capability control means comprises said frequency switching circuit for performing switching upon receipt of said external signal so as to input, to said sub-boosted power supply generating circuit, the oscillating signal of said first oscillating circuit when said external signal is in operation mode and the oscillating signal of said second oscillating circuit when said external signal is in standby mode.

4. The semiconductor integrated circuit of claim 1, wherein said sub-boosted power supply generating circuit comprises a plurality of sub-boosted power supply generating circuits in which capacitors for supplying charges to said internal boosted power supply node are provided and have different capacities, and said charge supply capability control means is a switching circuit which performs switching upon receipt of said external signal so as to boost said internal boosted power supply node by the sub-boosted power supply generating circuit in which the capacitor having the small capacitance is provided when the external signal is in the standby mode, and by the sub-boosted power supply generating circuit in which the capacitor having the great capacitance is provided when the external signal is in the operation mode.

5. The semiconductor integrated circuit of claim 1, wherein said controlled circuit is either a volatile memory such as a DRAM or a non-volatile memory such as an EEPROM or a ferroelectric memory, and said external signal is inputted to said gate electrode of the memory cells of said memory.

6. The semiconductor integrated circuit of claim 1, further comprising potential limiting means for limiting the potential of said internal boosted power supply node to a set level or less by drawing the charges of said internal boosted power supply node after the potential of said external signal is raised.

7. A semiconductor integrated circuit comprising:

a controlled circuit having a plurality of memory cells, each of said plurality of memory cells comprising a MOSFET having a gate electrode;

an internal boosted power supply node for boosting a signal input to a word line, said word line coupled to the gate electrode of the MOSFET of each of the plurality of memory cells; and a boosted power supply generating circuit for supplying charge to the internal boosted power supply node upon receipt of an external signal having an operation mode directing the controlled circuit to operate and a stand-by mode directing the controlled circuit to stand-by;

wherein said boosted power supply generating circuit comprises:

at least one main boosted power supply generating circuit for synchronously operating with the external signal, when the external signal is switched from a stand-by mode to an operation mode, to supply a predetermined amount of charge to the internal boosted power supply node;

an oscillating circuit for generating a first oscillating signal having a first frequency and a second oscillating signal having a second frequency which is higher than said first frequency;

a sub-boosted power supply generating circuit coupled to an output of the oscillating circuit and the internal boosted power supply node, said sub-boosted power supply generating circuit comprising a single charge pump and operative for generating a first charge level and a second charge level, said first charge level being larger than said second charge level, said first charge level and said second charge level corresponding to said first oscillating signal and said second oscillating signal, respectively;

a level detecting circuit for detecting the voltage level of the internal boosted power supply node; and charge supply capability control means for controlling the sub-boosted power supply generating circuit upon receipt of a signal output from the level detecting circuit so that the sub-boosted power supply generating circuit supplies the first charge level to the internal boosted power supply node when the level detected by the level detecting circuit is lower than a first set value, and supplies the second charge level to the internal boosted power supply node when the level detected by the level detecting circuit is higher than the first set value.

8. The semiconductor integrated circuit of claim 7, wherein said level detecting circuit comprises a first level detecting circuit for detecting that the voltage level of the internal boosted power supply node is lower than said first set value, and a second level detecting circuit for detecting that the voltage level of the internal boosted power supply node is higher than said first set value, and said charge supply capability control means performs switching on receipt of outputs of said level detecting circuits so as to the supply said second charge level when the voltage level of said internal boosted power supply node is higher than said first set value and to supply said first charge level when the voltage level of said internal boosted power supply node is lower than said first set value.

9. The semiconductor integrated circuit of claim 7, wherein said charge supply capability control means comprises a frequency switching circuit for controlling said oscillating circuit upon receipt of a detection signal of said level detecting circuit so as to generate said oscillating signal having the first frequency when the voltage level of said internal boosted power supply node is lower than said first set value, and said oscillating signal having the second frequency when the voltage level of said internal boosted power supply node is higher than said first set value.

10. The semiconductor integrated circuit of claim 9, wherein said oscillating circuit comprises a first oscillating circuit for generating said oscillating signal having said first frequency and a second oscillating circuit for generating said oscillating signal having said second frequency which is higher than said first frequency, and said charge supply capability control means comprises the frequency switching circuit for performing switching upon receipt of the detection signal of said level detecting circuit so as to input, to said sub-boosted power supply generating circuit, the oscillating signal of said first oscillating circuit when the voltage level of said internal boosted power supply node is lower than said first set value, and the oscillating signal of said second oscillating circuit when the voltage level of said internal boosted power supply node is hither than said first set value.

11. The semiconductor integrated circuit of claim 7, wherein said sub-boosted power supply generating circuit comprises a plurality of sub-boosted power supply generating circuits in which capacitors for supplying charges to said internal boosted power supply node are provided and have different capacities, and said charge supply capability control means is a switching circuit which performs switching upon receipt of the detection signal of said level detecting circuit so as to boost said internal boosted power supply node by the sub-boosted power supply generating circuit in which the capacitor having the small capacitance is provided when the voltage level of said internal boosted power supply node is higher than said first value, and by the sub-boosted power supply generating circuit in which the capacitor having the great capacitance is provided when the voltage level of said internal boosted power supply node is lower than said first set value.

12. The semiconductor integrated circuit of claim 7, wherein said controlled circuit is either a volatile memory such as a DRAM or a non-volatile memory such as an EEPROM or a ferroelectric memory, and said external signal is inputted to said gate electrode of the memory cells of said memory.

13. The semiconductor integrated circuit of claim 7, further comprising potential limiting means for limiting the potential of said internal boosted power supply node to a set level or less by drawing the charges of said internal boosted power supply node after the potential of said external signal is raised.

14. A semiconductor integrated circuit comprising;

a controlled circuit having a plurality of active elements, an internal boosted power supply node connected to said active elements, and a boosted power supply generating circuit for supplying charges to said internal boosted power supply node on receipt of an external signal which directs said active elements of said controlled circuit to operate or stand by, wherein said boosted power supply generating circuit comprises;

at least one main boosted power supply generating circuit which operates synchronously with said external signal to supply a predetermined amount of charge to said internal boosted power supply node when said external signal is in operation mode, an oscillating circuit for generating an oscillating signal, a sub-boosted power supply generating circuit for supplying an amount of charge corresponding to the frequency of an oscillating signal generated by said oscillating circuit on receipt of the oscillating signal, and potential limiting means for drawing the charges of said internal boosted power supply node so as to limit the potential of said internal boosted power supply node to the set level or less after a word line coupled to said active elements in said controlled circuit rises.

15. The semiconductor integrated circuit of claim 14, wherein said potential limiting means comprises;

a potential limiting circuit having an output coupled to said internal boosted power supply node, said potential limiting circuit operative for drawing the charges of said internal boosted power supply node on receipt of the external signal in operation mode, and a control circuit for performing control so as to input the external signal in the operation mode to said potential limiting circuit after a time for which said external signal is changed from the standby mode to the operation mode and said internal boosted power supply node is lowered by power consumption by said active element of said controlled circuit portion.

16. A semiconductor integrated circuit comprising;

a controlled circuit having a plurality of active elements, an internal boosted power supply node connected to said active elements to boost a signal inputted to said active elements, and a boosted power supply generating circuit for supplying charges to said internal boosted power supply node on receipt of an external signal which directs data fetch from said controlled circuit, wherein said boosted power supply generating circuit comprises;

a control circuit for outputting an output determination signal for determining the output operation of the data from said controlled circuit in response to said external signal, an output circuit having a transistor controlled by said internal boosted power supply node for outputting the output data on receipt of the output determination signal from said control circuit, and a main boosted power supply generating circuit having the output connected to said internal boosted power supply node and said output circuit for supplying charges to the gate of said transistor of said output circuit and said internal boosted power supply node on receipt of an enable signal of said control circuit.

17. The semiconductor integrated circuit of claim 16, wherein said boosted power supply generating circuit operates synchronously with the fall of a column address strobe signal (XCAS) or an output enable signal (XOE) from the "H" level to the "L" level, and supplies charges to said internal boosted power supply node.

18. The semiconductor integrated circuit of claim 16, wherein said boosted power supply generating circuit operates synchronously with the fall of XCAS and XOE from "H" level to the "L" level when a write enable signal (XWE) has the "H" level, and supplies charges to said internal boosted power supply node.

19. The semiconductor integrated circuit of claim 16, wherein said boosted power supply generating circuit supplies charges to said internal boosted power supply node only when outputting High data.

* * * * *

UNITED STATES PATENT AND TRADEMARK OFFICE
CERTIFICATE OF CORRECTION

| | |
|---|---|
| PATENT NO. | : 5,881,012 |
| DATED | : March 9, 1999 |
| INVENTOR(S) | : Toshiaki Kawasaki et al. |

It is certified that error appears in the above-identified patent and that said Letters Patent is hereby corrected as shown below:

Claim 10,
Line 56, delete "hither" and insert -- higher --.

Drawings,
Replace drawing Figs. 1-3, 5, 8-10 and 13 with the Figs. 1-3, 5, 8-10 and 13 as shown on the following pages:

The title page should be deleted to appear as per attached title page.

Signed and Sealed this

Twelfth Day of March, 2002

*Attest:*

JAMES E. ROGAN
*Attesting Officer*    *Director of the United States Patent and Trademark Office*

United States Patent [19]
Kawasaki et al.

[11] Patent Number: 5,881,012
[45] Date of Patent: Mar. 9, 1999

[54] SEMICONDUCTOR INTEGRATED CIRCUIT

[75] Inventors: Toshiaki Kawasaki; Akinori Shibayama, both of Osaka, Japan

[73] Assignee: Matsushita Electronics Corporation, Osaka, Japan

[21] Appl. No.: 633,684

[22] Filed: Apr. 17, 1996

[30] Foreign Application Priority Data

Apr. 17, 1995 [JP] Japan ................................. 7-091002

[51] Int. Cl.$^6$ .............................. G11C 5/14; H03K 3/353
[52] U.S. Cl. ..................... 365/226; 365/189.09; 327/537
[58] Field of Search ........................ 365/189.09, 189.11, 365/226; 327/536, 537, 540, 541

[56] References Cited

U.S. PATENT DOCUMENTS

| | | | |
|---|---|---|---|
| 5,335,205 | 8/1994 | Ogihara | 365/189.09 |
| 5,396,114 | 3/1995 | Lee | 327/538 |
| 5,434,820 | 7/1995 | Kim | 365/189.09 |
| 5,446,418 | 8/1995 | Hara | 365/189.09 |
| 5,526,253 | 6/1996 | Daley | 363/59 |

*Primary Examiner*—David C. Nelms
*Assistant Examiner*—Son Mai
*Attorney, Agent, or Firm*—McDermott, Will & Emery

[57] ABSTRACT

A frequency switching circuit is controlled by a low address strobe signal XRAS. A sub-boosted power supply generating circuit is driven at a low frequency generated by a first oscillating circuit during the standby of a DRAM, and at a high frequency generated by a second oscillating circuit during the operation of the DRAM. The sub-boosted power supply generating circuit is driven in a shorter cycle during the operation than during the standby. Consequently, charges are supplied to a booster power source to boost the voltage level thereof. Accordingly, even if the period of the operation state is increased, a drop in voltage level of the boosted power supply caused by a transistor off leak current and a junction leak current can be controlled. Thus, the malfunction of a circuit can be prevented from occurring due to the drop in voltage level of the boosted power supply. The drop in voltage level of the boosted power supply can be controlled during the operation of the DRAM so that it is possible to implement a boosted power supply generating circuit which can prevent the malfunction of the circuit from occurring.

19 Claims, 13 Drawing Sheets

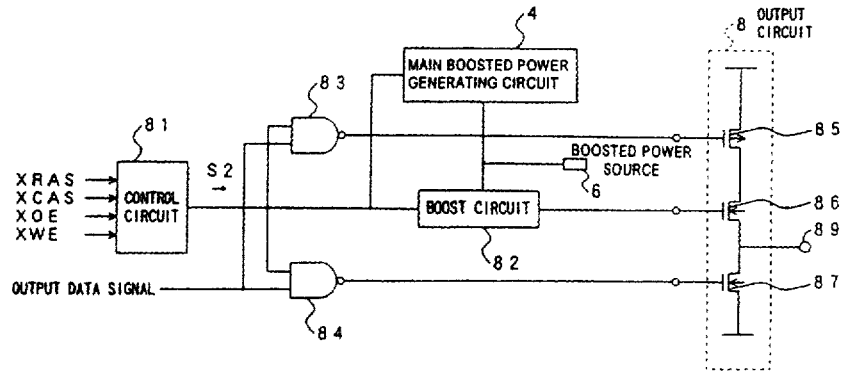

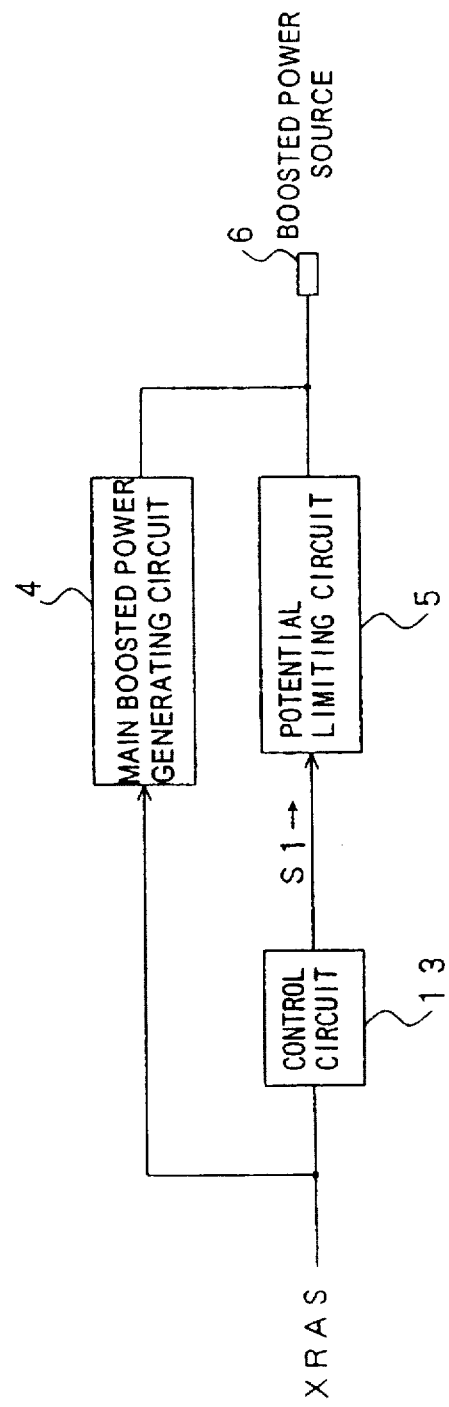

UNITED STATES PATENT AND TRADEMARK OFFICE
CERTIFICATE OF CORRECTION

PATENT NO. : 5,881,012
DATED : March 9, 1999
INVENTOR(S) : Toshiaki Kawasaki et al.

It is certified that error appears in the above-identified patent and that said Letters Patent is hereby corrected as shown below:

Claim 10,
Line 56, delete "hither" and insert -- higher --.

Drawings,
Replace drawing Figs. 1-3, 5, 8-10 and 13 with the Figs. 1-3, 5, 8-10 and 13 as shown on the following pages:

The title page should be deleted to appear as per attached title page.

This certificate supersedes Certificate of Correction issued March 12, 2002

Signed and Sealed this

Ninth Day of April, 2002

Attest:

Attesting Officer

JAMES E. ROGAN
Director of the United States Patent and Trademark Office

United States Patent [19]
Kawasaki et al.

[11] Patent Number: 5,881,012
[45] Date of Patent: Mar. 9, 1999

[54] SEMICONDUCTOR INTEGRATED CIRCUIT

[75] Inventors: Toshiaki Kawasaki; Akinori Shibayama, both of Osaka, Japan

[73] Assignee: Matsushita Electronics Corporation, Osaka, Japan

[21] Appl. No.: 633,684

[22] Filed: Apr. 17, 1996

[30] Foreign Application Priority Data

Apr. 17, 1995 [JP] Japan ............... 7-091002

[51] Int. Cl.⁶ ............... G11C 5/14; H03K 3/353
[52] U.S. Cl. ............... 365/226; 365/189.09; 327/537
[58] Field of Search ............... 365/189.09, 189.11, 365/226; 327/536, 537, 540, 541

[56] References Cited

U.S. PATENT DOCUMENTS

| | | | |
|---|---|---|---|
| 5,335,205 | 8/1994 | Ogihara | 365/189.09 |
| 5,396,114 | 3/1995 | Lee | 327/538 |
| 5,434,820 | 7/1995 | Kim | 365/189.09 |
| 5,446,418 | 8/1995 | Hara | 365/189.09 |
| 5,526,253 | 6/1996 | Daley | 363/59 |

Primary Examiner—David C. Nelms
Assistant Examiner—Son Mai
Attorney, Agent, or Firm—McDermott, Will & Emery

[57] ABSTRACT

A frequency switching circuit is controlled by a low address strobe signal XRAS. A sub-boosted power supply generating circuit is driven at a low frequency generated by a first oscillating circuit during the standby of a DRAM, and at a high frequency generated by a second oscillating circuit during the operation of the DRAM. The sub-boosted power supply generating circuit is driven in a shorter cycle during the operation than during the standby. Consequently, charges are supplied to a booster power source to boost the voltage level thereof. Accordingly, even if the period of the operation state is increased, a drop in voltage level of the boosted power supply caused by a transistor off leak current and a junction leak current can be controlled. Thus, the malfunction of a circuit can be prevented from occurring due to the drop in voltage level of the boosted power supply. The drop in voltage level of the boosted power supply can be controlled during the operation of the DRAM so that it is possible to implement a boosted power supply generating circuit which can prevent the malfunction of the circuit from occurring.

19 Claims, 13 Drawing Sheets